(12) United States Patent (10) Patent No.: US 8,797,512 B2
Stettner et al. (45) Date of Patent: Aug. 5, 2014

(54) AUTOMATIC RANGE CORRECTED FLASH LADAR CAMERA

(75) Inventors: Roger Stettner, Santa Barbara, CA (US); Howard Bailey, Santa Barbara, CA (US); Brad Short, Goleta, CA (US); Laurent Heughebaert, Santa Paula, CA (US); Patrick Gilliland, Santa Barbara, CA (US)

(73) Assignee: Advanced Scientific Concepts, Inc., Santa Barbara, CA (US)

( * ) Notice: Subject to any disclaimer, the term of this patent is extended or adjusted under 35 U.S.C. 154(b) by 0 days.

(21) Appl. No.: 13/615,881

(22) Filed: Sep. 14, 2012

(65) Prior Publication Data

US 2013/0128257 A1 May 23, 2013

Related U.S. Application Data

(60) Provisional application No. 61/535,113, filed on Sep. 15, 2011.

(51) Int. Cl.
*G01C 3/08* (2006.01)

(52) U.S. Cl.
USPC ....... 356/4.01; 356/3.01; 356/5.01; 356/5.15; 356/5.1; 356/9; 244/183

(58) Field of Classification Search
USPC .................. 356/3.01, 4.01, 5.01, 5.1, 5.15, 9; 244/183
See application file for complete search history.

(56) References Cited

U.S. PATENT DOCUMENTS

| | | | |
|---|---|---|---|
| 4,907,237 A * | 3/1990 | Dahmani et al. ................. | 372/32 |
| 5,587,680 A * | 12/1996 | Smith ............................ | 327/291 |
| 5,629,524 A | 5/1997 | Stettner et al. | |
| 5,696,577 A | 12/1997 | Stettner et al. | |
| 6,133,989 A | 10/2000 | Stettner et al. | |
| 6,362,482 B1 | 3/2002 | Stettner et al. | |
| 6,373,865 B1 * | 4/2002 | Nettleton et al. ................ | 372/10 |
| 6,392,747 B1 | 5/2002 | Allen et al. | |
| 6,414,746 B1 | 7/2002 | Stettner et al. | |
| 6,639,733 B2 * | 10/2003 | Minano et al. ................. | 359/728 |
| 6,765,729 B2 * | 7/2004 | Perrin et al. ................... | 359/727 |
| 7,200,161 B2 * | 4/2007 | Vetrovec ......................... | 372/70 |
| 7,206,062 B2 | 4/2007 | Asbrock et al. | |
| 7,369,327 B1 * | 5/2008 | Nishioka ....................... | 359/726 |
| 7,608,527 B2 * | 10/2009 | Tanaka et al. ................. | 438/487 |
| 8,342,074 B1 * | 1/2013 | Sane et al. .................... | 89/36.14 |
| 8,454,356 B2 * | 6/2013 | Camm et al. .................. | 432/253 |
| 8,537,864 B2 * | 9/2013 | Gu et al. .......................... | 372/6 |
| 8,633,660 B2 * | 1/2014 | Cho et al. ...................... | 315/308 |
| 2002/0117340 A1 | 8/2002 | Stettner | |
| 2005/0051815 A1 * | 3/2005 | Snyder ......................... | 257/288 |
| 2007/0263693 A1 * | 11/2007 | Essaian et al. ................. | 372/75 |
| 2009/0022201 A1 * | 1/2009 | Krupke et al. ................ | 372/75 |
| 2012/0261516 A1 * | 10/2012 | Gilliland et al. .............. | 244/183 |

* cited by examiner

*Primary Examiner* — Luke Ratcliffe
*Assistant Examiner* — Samantha K Abraham
(74) *Attorney, Agent, or Firm* — Allen I. Rubenstein

(57) ABSTRACT

A three dimensional imaging camera comprises a system controller, pulsed laser transmitter, receiving optics, an infrared focal plane array light detector, and an image processor. The described invention is capable of developing a complete 3-D scene from a single point of view. The 3-D imaging camera utilizes a pulsed laser transmitter capable of illuminating an entire scene with a single high power flash of light. The 3-D imaging camera employs a system controller to trigger a pulse of high intensity light from the pulsed laser transmitter, and counts the time from the start of the transmitter light pulse. The light reflected from the illuminated scene impinges on a receiving optics and is detected by a focal plane array optical detector. An image processor applies image enhancing algorithms to improve the image quality and develop object data for subjects in the field of view of the flash ladar imaging camera.

50 Claims, 14 Drawing Sheets

Side Pumped Laser Transmitter Block Diagram

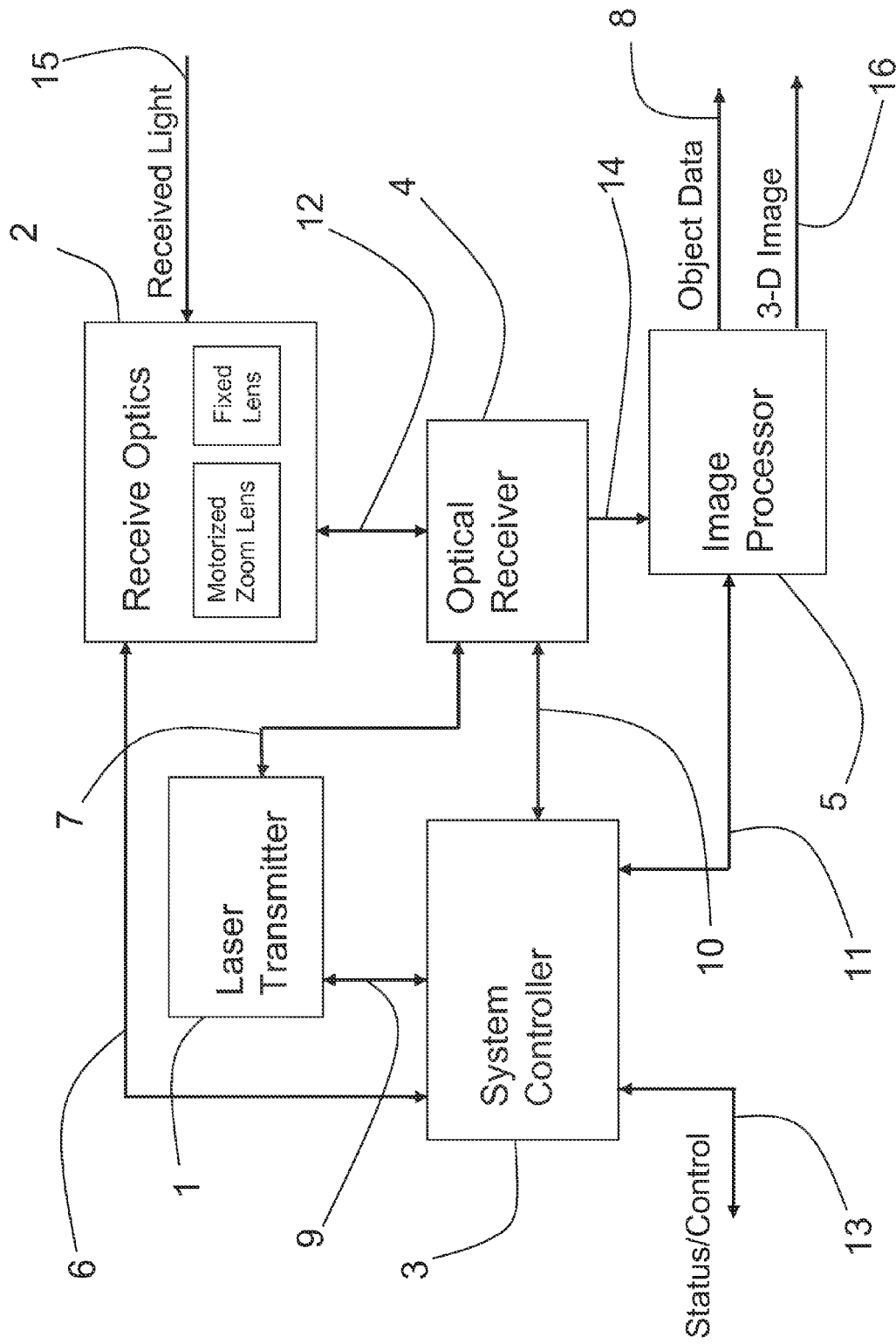
Figure 1. ARC Flash LADAR System Block Diagram

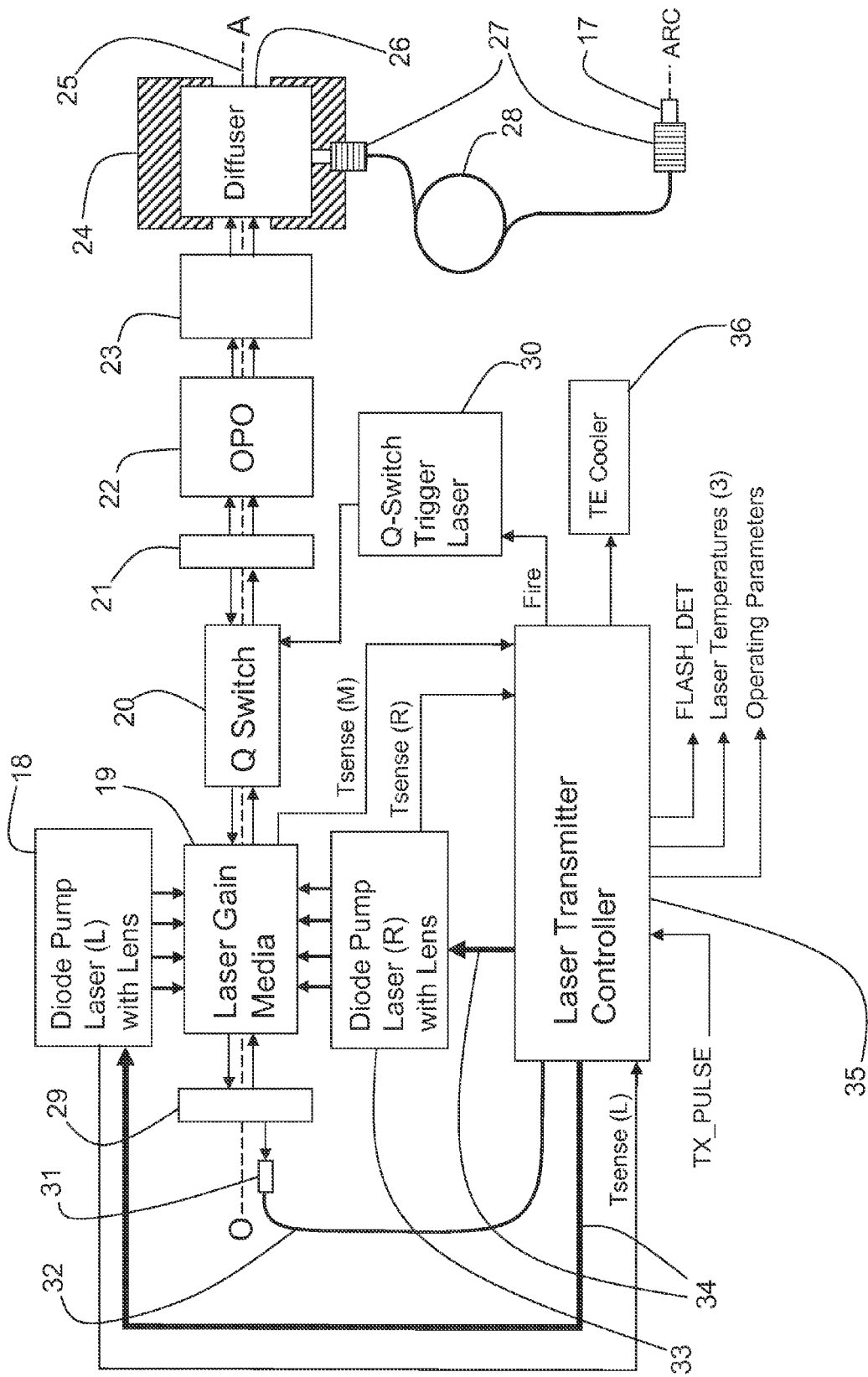
Figure 2. Side Pumped Laser Transmitter Block Diagram

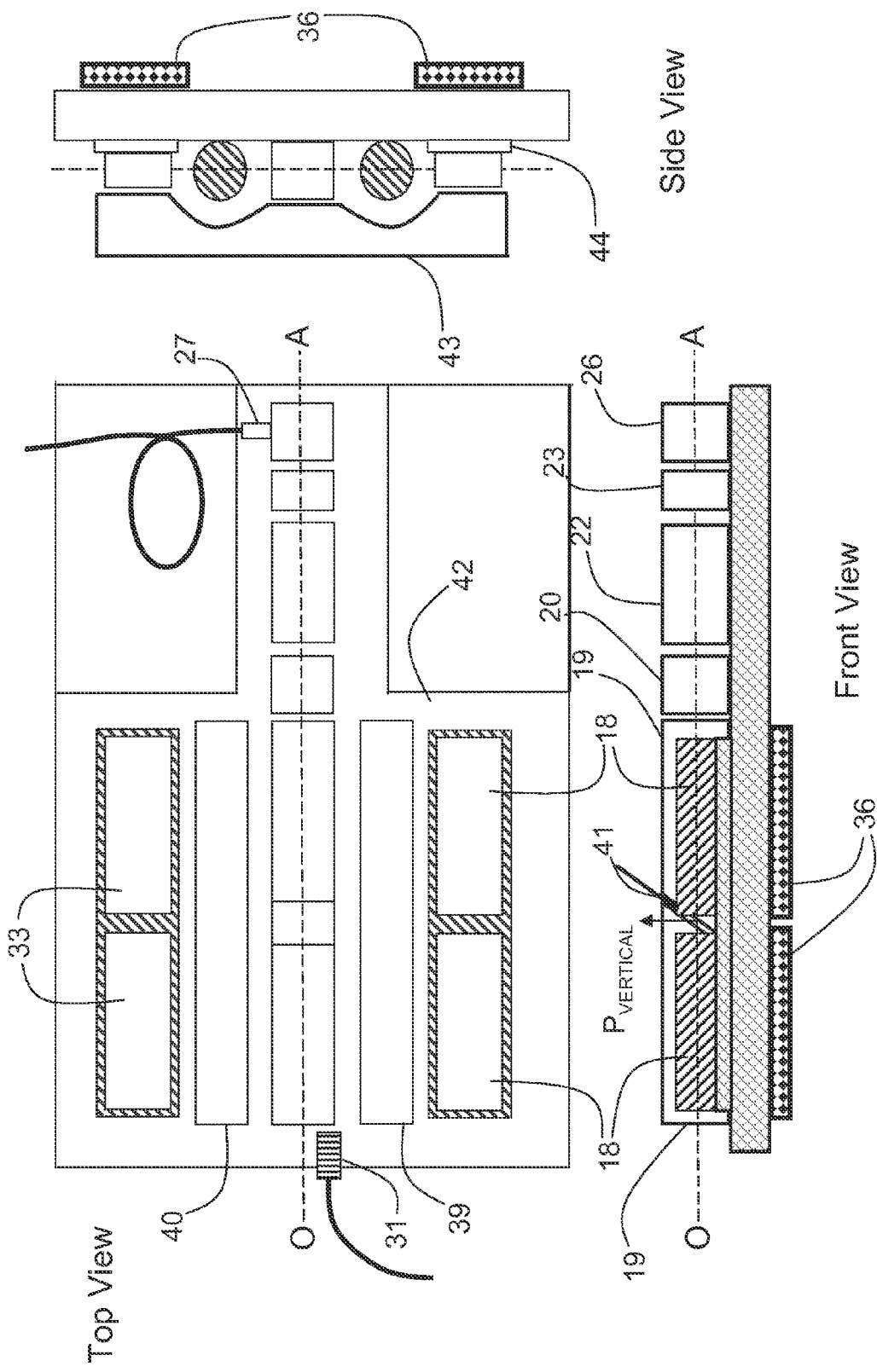

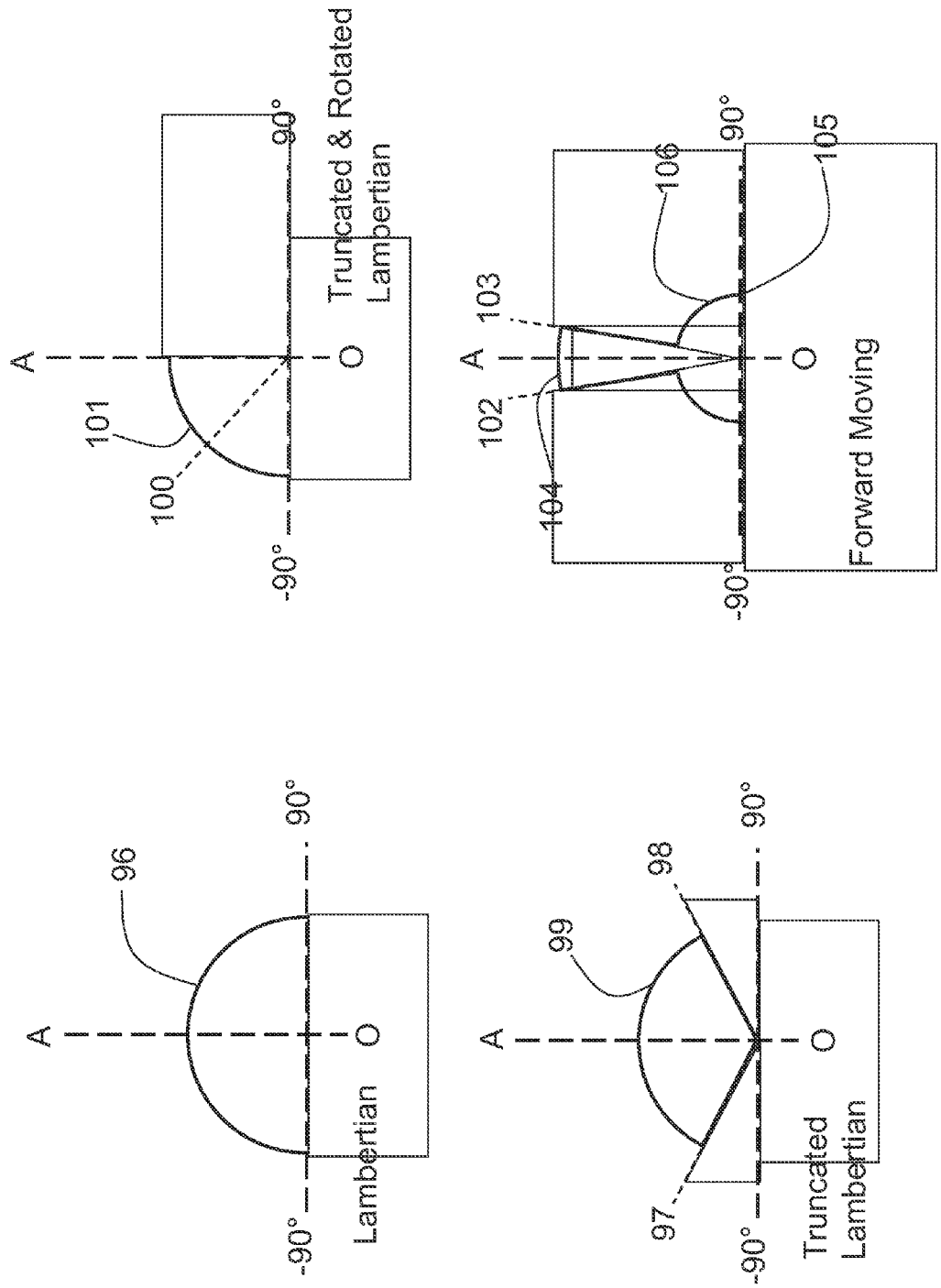

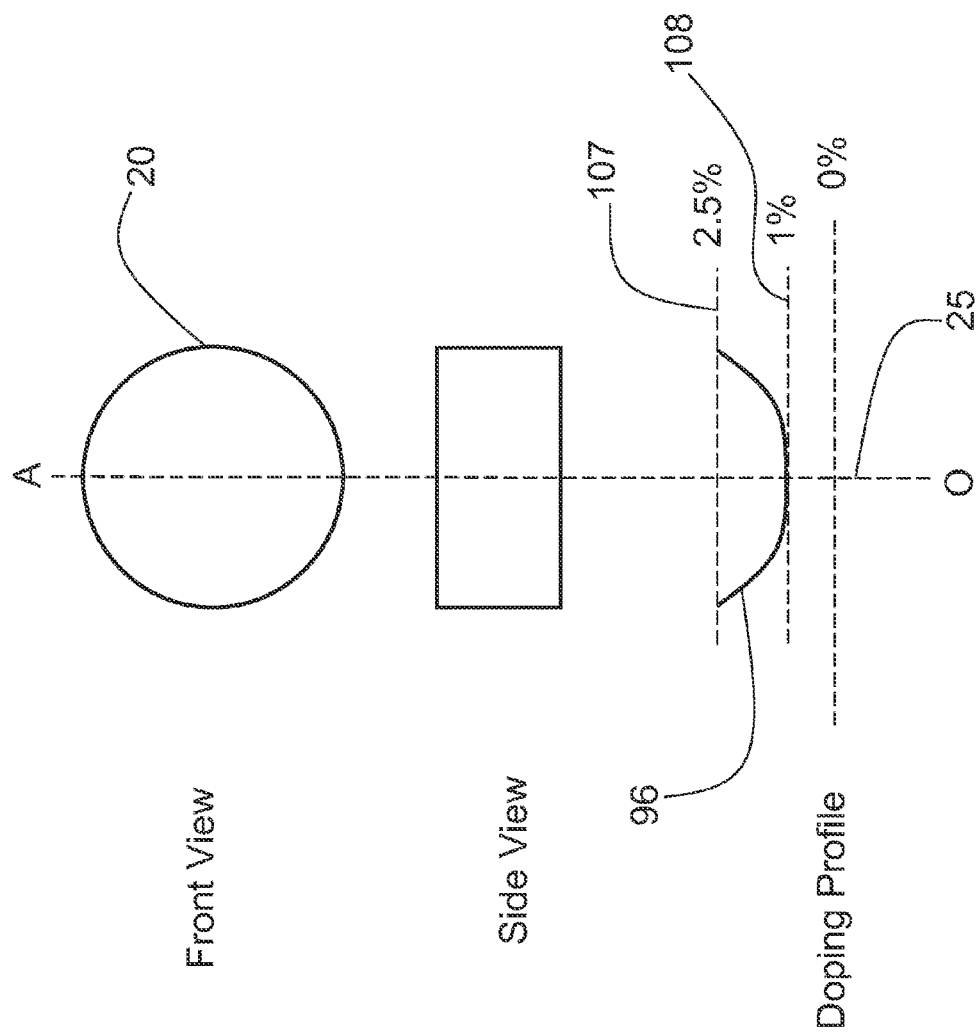
Figure 2C. Gain Guiding Q-Switch

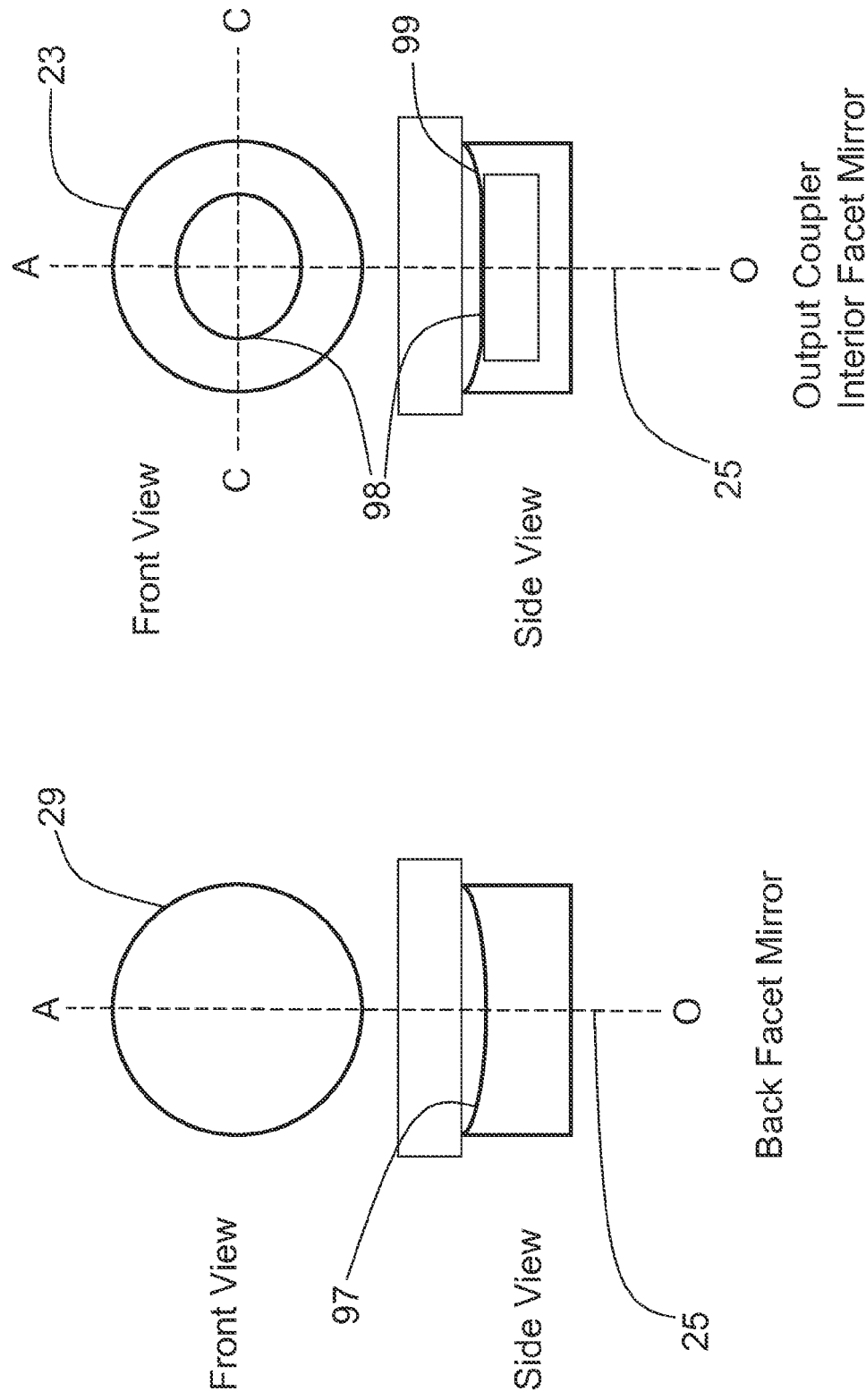

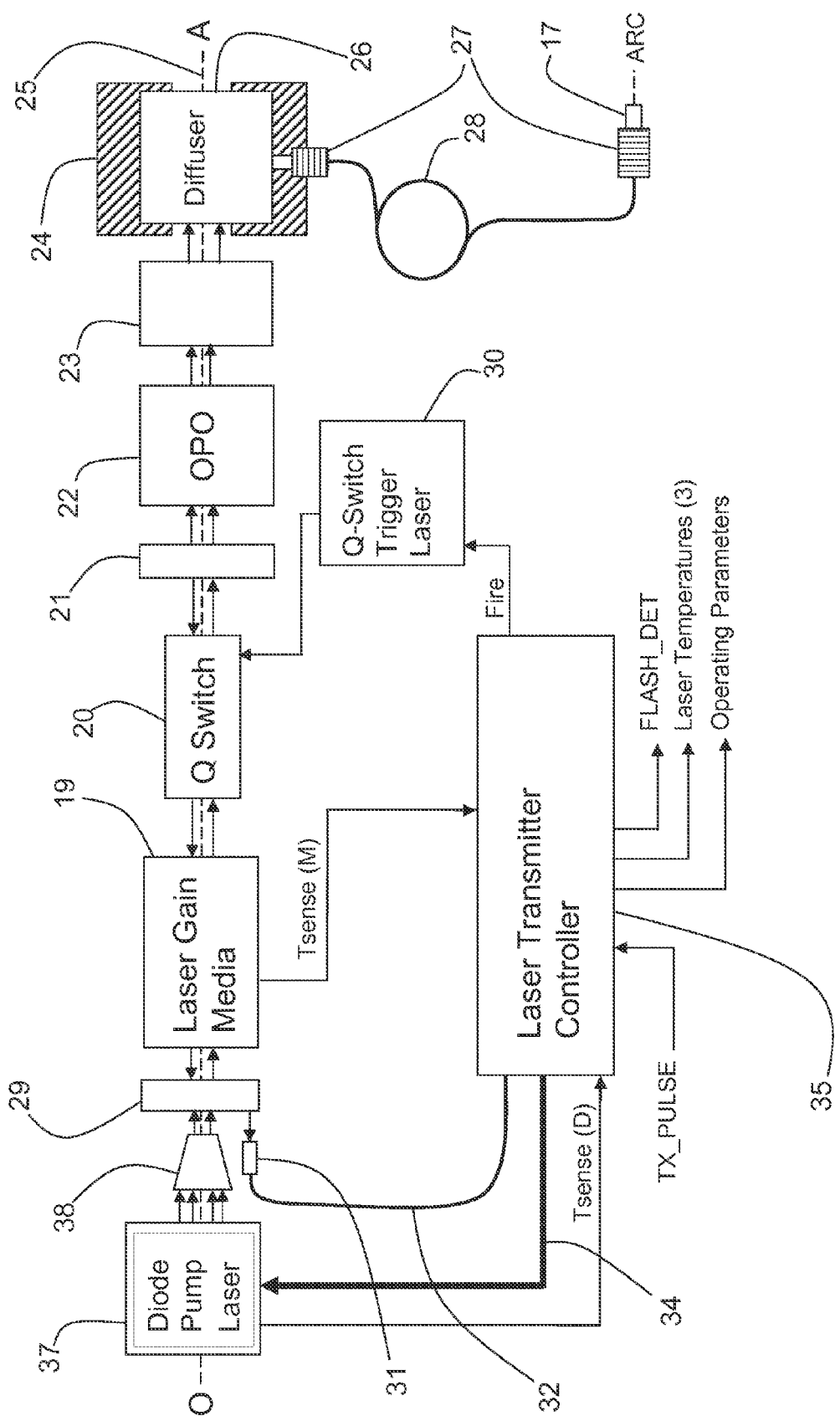
Figure 3. End Pumped Laser Transmitter Block Diagram

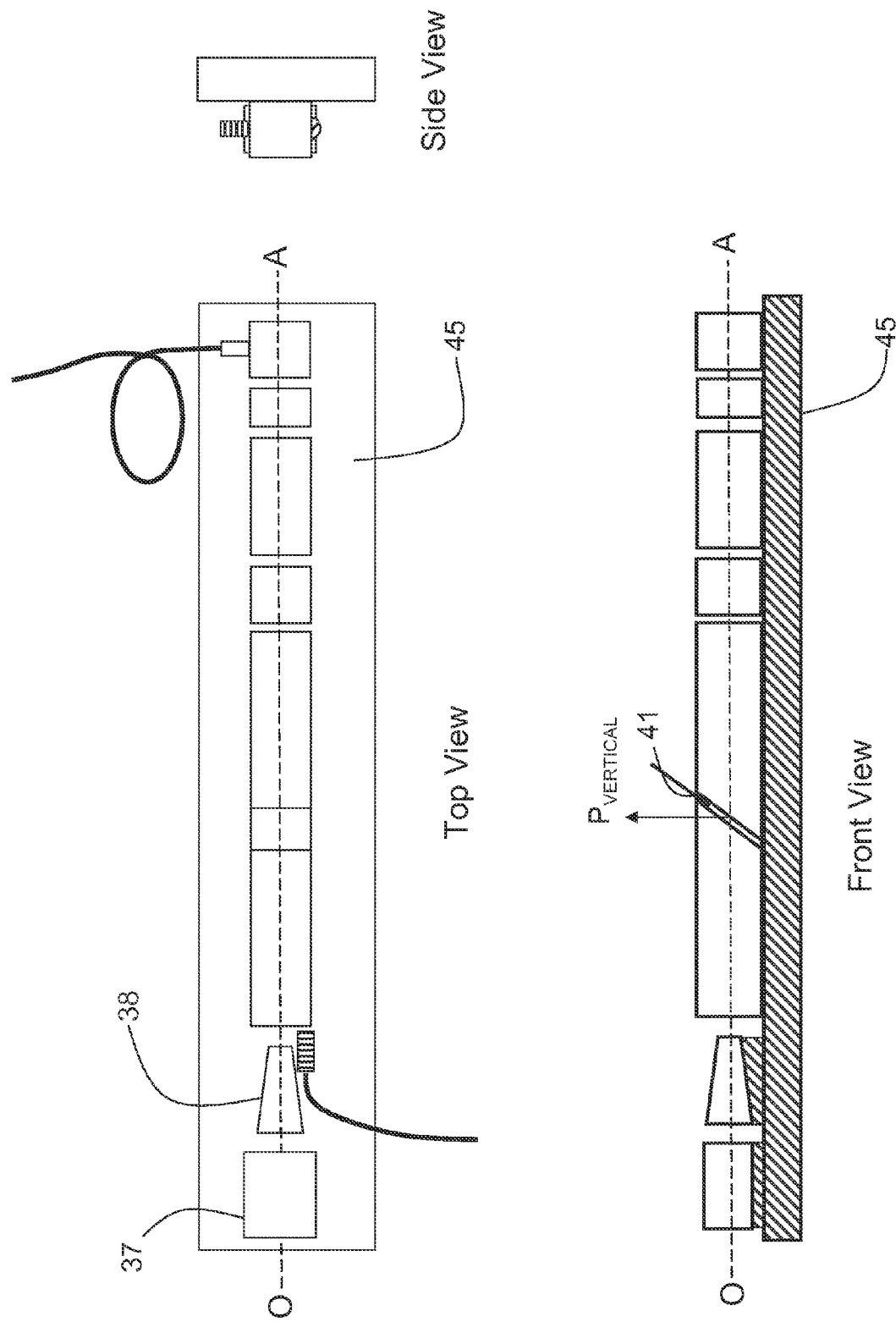
Figure 3A. End Pumped Laser Transmitter Layout

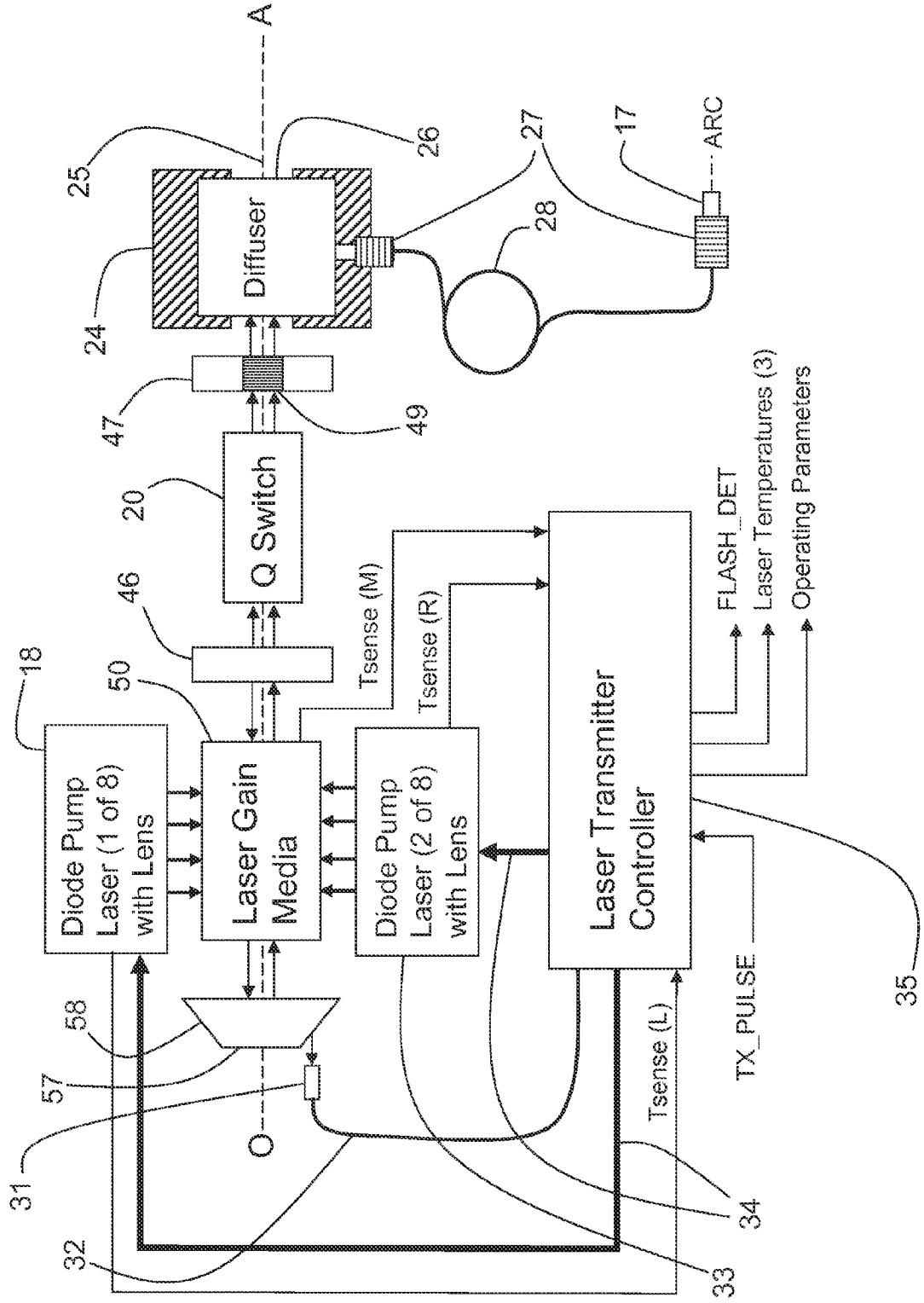
Figure 4. Side Pumped Disc Laser Block Diagram

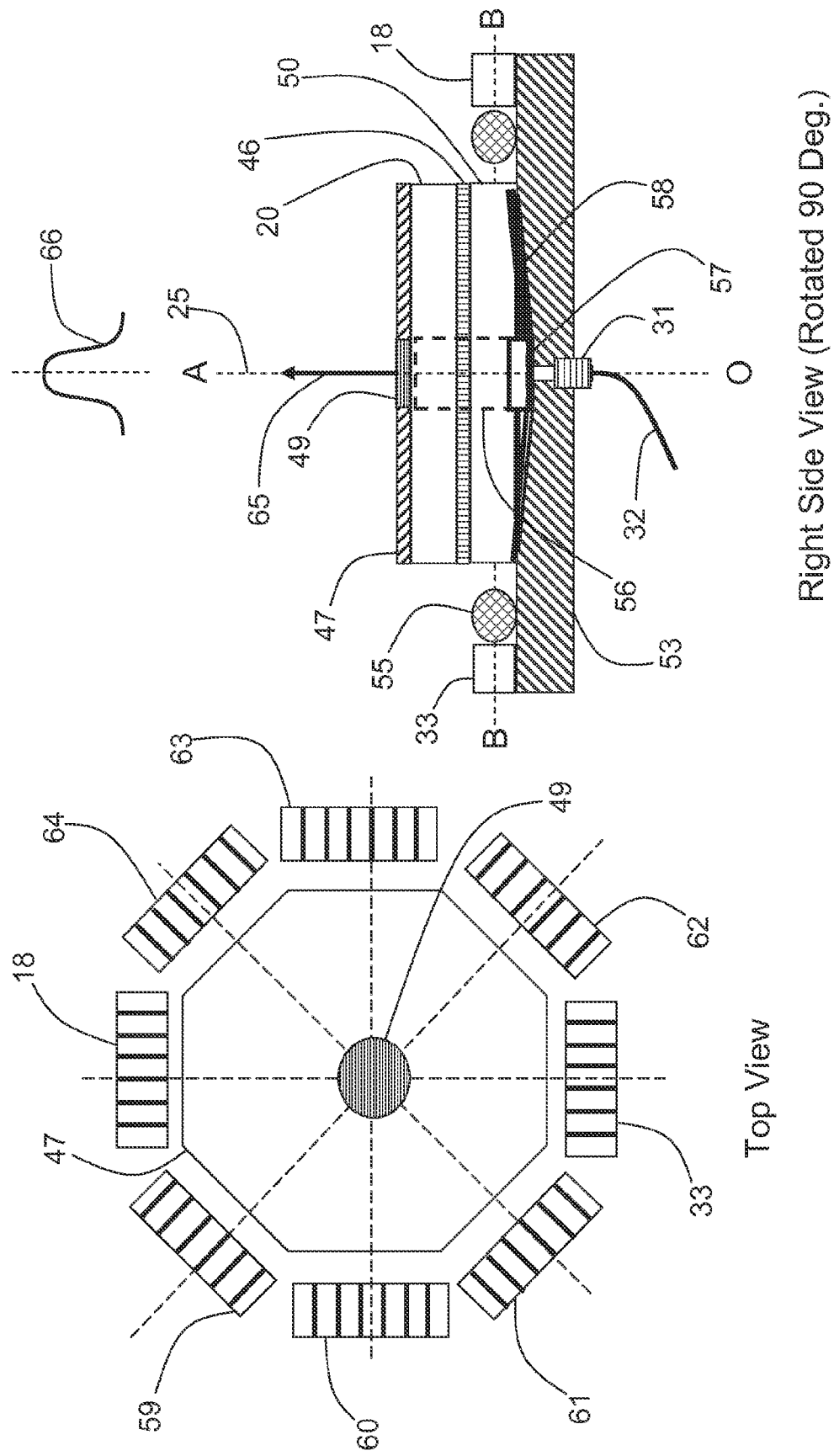
Figure 4A. Side Pumped Disc Laser Layout

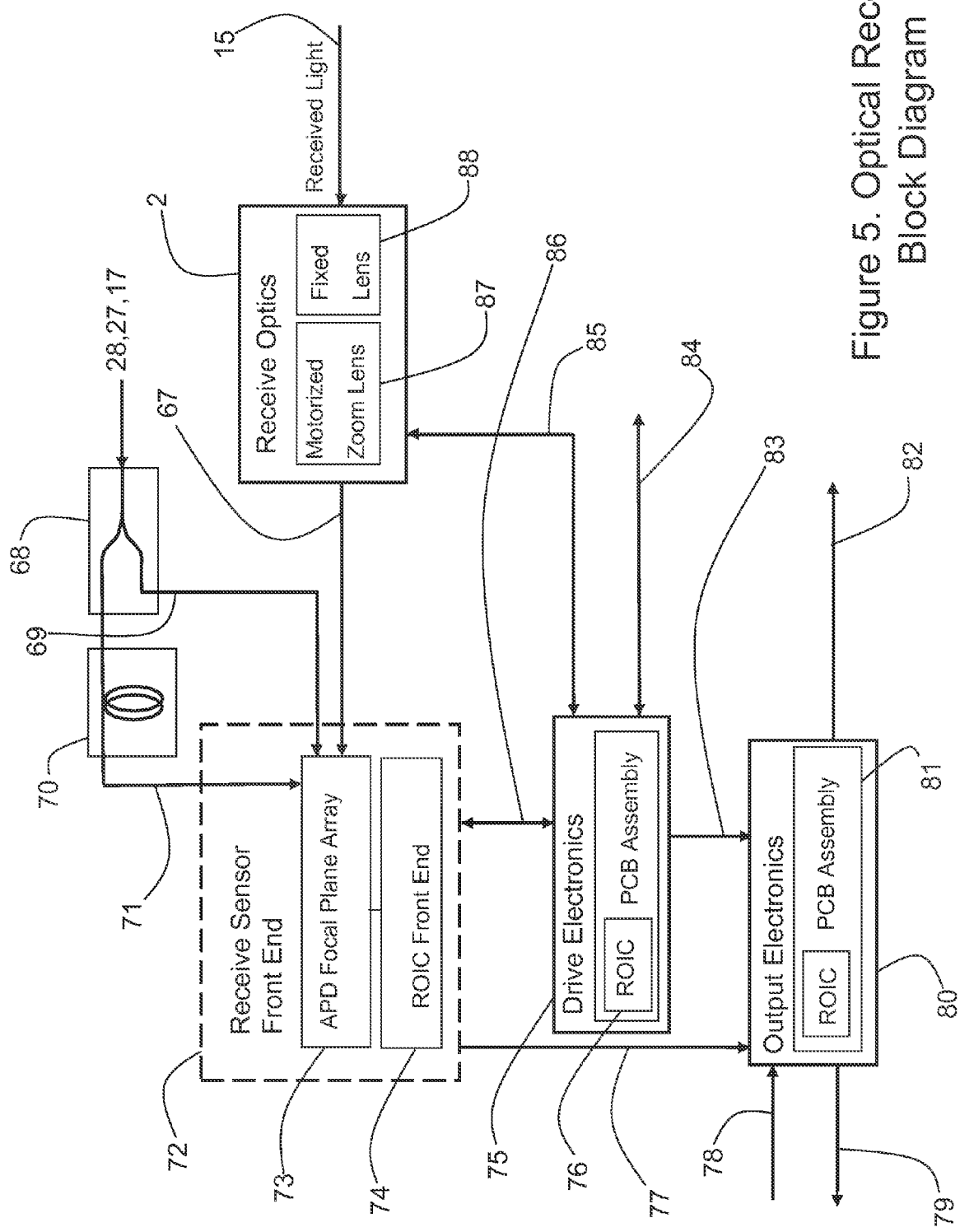
Figure 5. Optical Receiver Block Diagram

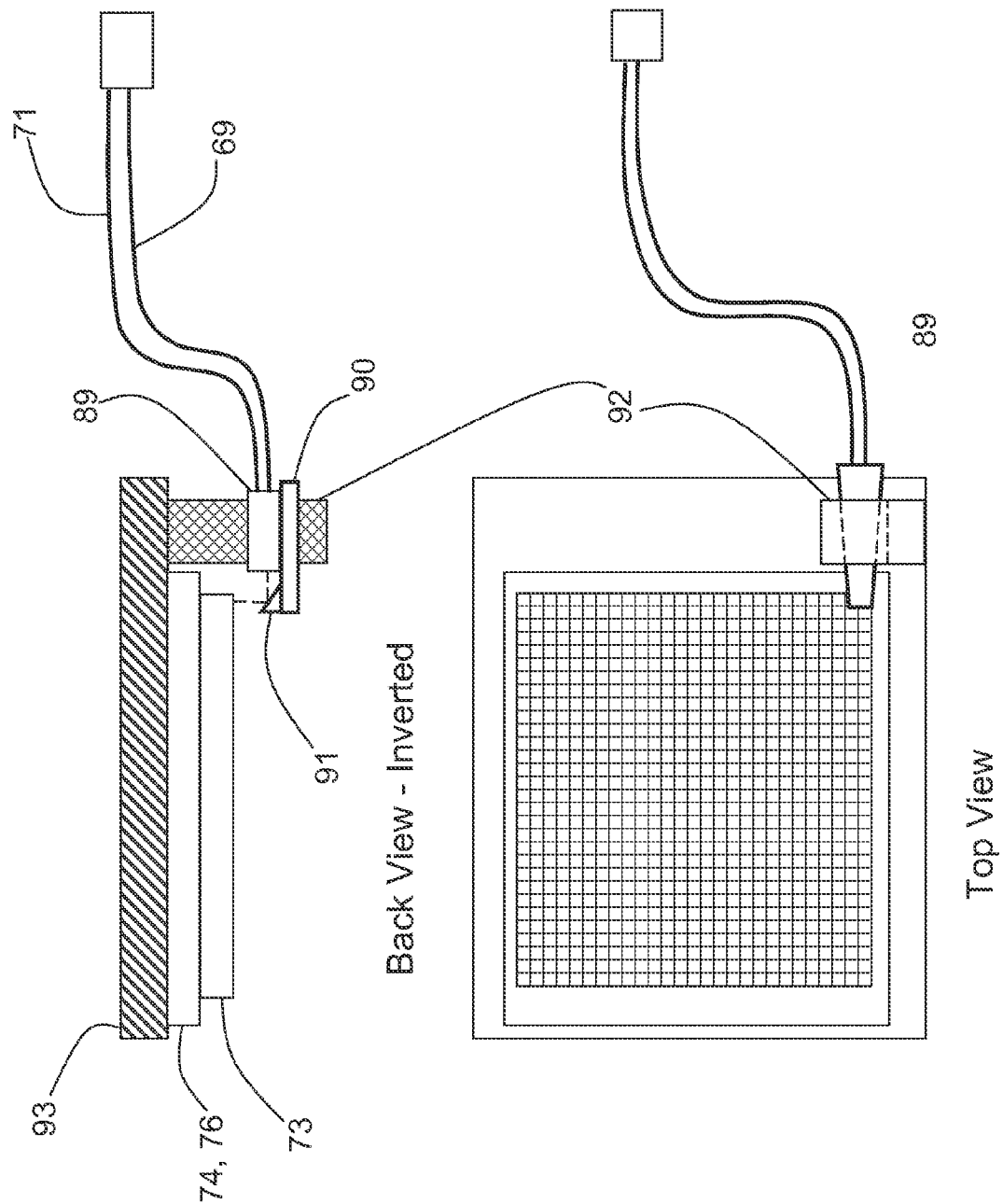

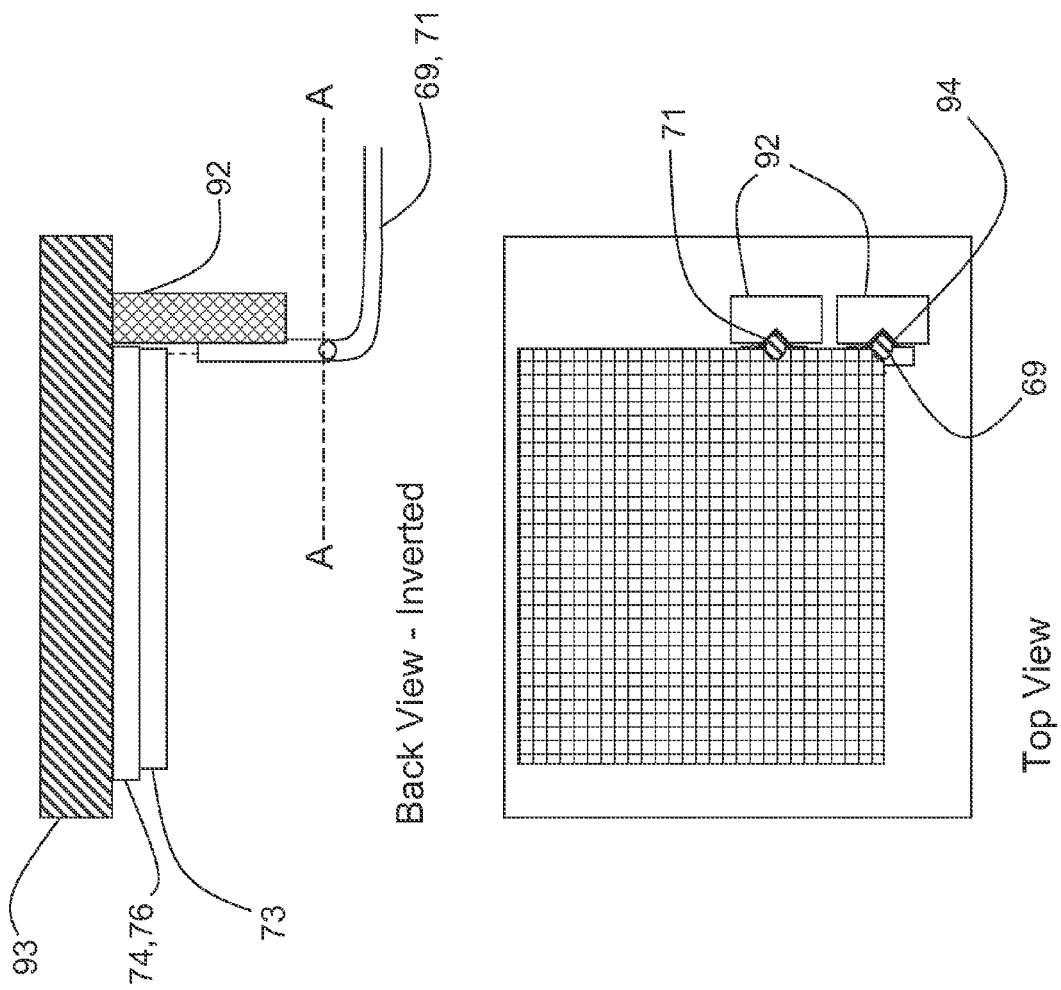

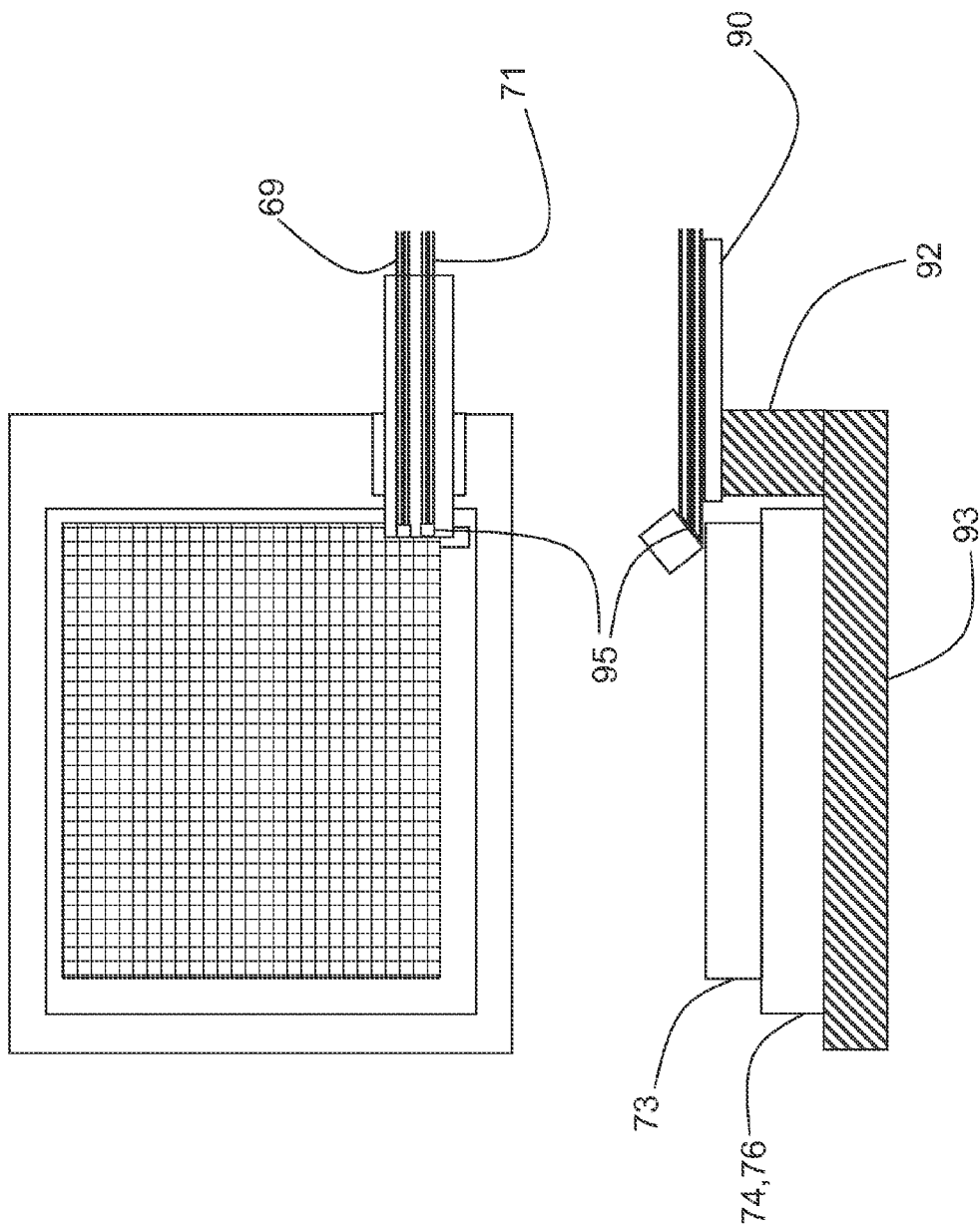
Figure 6B. Advanced ARC Pixel Coupling

AUTOMATIC RANGE CORRECTED FLASH LADAR CAMERA

RELATED APPLICATIONS

This application claims priority to U.S. Provisional Application No. 61/535,113 filed Sep. 15, 2011 which is incorporated herein by reference. Additionally, the subject matter disclosed in U.S. Pat. Nos. 5,696,577, 6,133,989, 5,629,524, 6,414,746, 6,362,482, and U.S. Patent Application Publication No. 2002/0117340 are incorporated herein by reference.

BACKGROUND

Conventional 2-D cameras for capturing visible images rely on rectangular arrays of pixellated light sensitive Charge Coupled Devices (CCDs) or CMOS sensors. These sensors are generically referred to as focal plane arrays. They are positioned directly behind an imaging lens system in the focal plane of the lens. Similarly, the laser radar described herein relies on the performance of a focal plane array detector. The detector in this case must respond to wavelengths outside of the visible range, in the near infrared spectrum. The detector material is a binary compound of Indium Phosphide (InP), or a more exotic quaternary compound such as Indium Gallium Arsenide Phosphide (InGaAsP) or a ternary combination of InGaP, InGaAs, or InAsP. A readout integrated circuit with an input amplifier is connected to each pixel of the focal plane array, to amplify and condition the laser radar return signals, enabling object detection and range determination. An internal clock and a timing circuit associated with each pixel in the infrared Focal Plane Array detector provide a range measurement for each pixel. The infrared focal plane array detector and readout integrated circuit input amplifier together exhibit a time delay which varies with input signal amplitude, complicating the time of arrival determination for any reflected light energy. To mitigate this effect, an optical sample of the transmitted laser pulse is fed back through a sacrificial pixel in the infrared focal plane array and through the accompanying input amplifier in the readout integrated circuit, producing a stable, amplitude adjusted zero time reference. Additionally, a precision delayed sample of the transmitted laser pulse is provided at the same sacrificial pixel of the infrared focal plane array, which allows for clock frequency calibration. These two performance features are referred to herein as Automatic Range Correction.

The wavelength of choice for the laser radar is typically 1570 nanometers, which enables the invention in two respects: first, the 1570 nm wavelength is inherently safer to the human eye, allowing for greater power transmission, and thus greater distance performance, and second, there are laser system components commercially available at this wavelength which enable the design and production of a laser capable of producing the high energy pulse required. Other wavelengths may also be suitable for the laser radar and these other wavelengths may be utilized within the scope of this invention.

In the design of a pulsed laser transmitter several limitations must be considered. The high peak power requirement necessitates the use of a solid state laser, typically employing a Neodymium-YAG laser rod, or Erbium glass laser rod and a saturable Q-switch material, such as Chromium doped Nd-YAG. Performance limitations of solid state lasers employing these materials include the inability to accurately predict the delay from a trigger pulse to the onset of a lasing pulse, modal stability, laser pulse shape, and laser pulse repeatability. Further, low power efficiency and thermal stability issues with the solid state materials create additional challenges.

Therefore it is an object of this invention to provide a pulsed laser transmitter with a higher efficiency, repeatable pulse shape, stability of wavelength, resistance to thermal stress, and a mechanism to overcome the system limitations imposed by the unpredictable nature of the laser pulse startup delay, and to mitigate the effects of variable time delays in the optical receiver focal plane array detector and readout integrated circuit.

FIELD OF THE INVENTION

The present invention relates to the field of remote sensing of objects and the application of lasers to the problems of 3-D imaging, remote object detection and definition, terrain mapping, vehicle guidance, and collision avoidance. Many attempts have been made to solve the problem of how to create the true 3-D imaging capability which would simultaneously enable all of the applications cited. The instant invention makes use of a number of new and innovative discoveries and combinations of previously known technologies to realize the present embodiments which enable the user to operate in a true 3-D mode with enhanced accuracy. This ability to operate the flash laser ranging and detection device is provided by practicing the invention as described herein. This invention relies on the performance of a multiple pixel, infrared laser radar for capturing three-dimensional images of objects or scenes within the field of view with a single laser pulse, with high spatial and range resolution.

BACKGROUND

Many laser radar systems have been built which rely on the transmission of a high energy illuminating pulse. Most often these systems rely on solid state lasers operating in the near infrared with a lasing media of Neodymium-YAG or Erbium doped glass. Many of these systems utilize multiple pulses over a period of time to detect remote objects and improve range accuracy. These systems are often based on a single detector optical receiver. To develop a complete picture of a scene, the laser and optical receiver must be scanned over the field of view, resulting in a shifting positional relationship between objects in motion within the scene. Flash ladar systems overcome this performance shortcoming by detecting the range to all objects in the scene simultaneously upon the event of the flash of the illuminating laser pulse.

U.S. Pat. No. 6,392,747 awarded to Allen and McCormack and assigned to Raytheon, describes an improved scanning ladar, but makes the prediction regarding possible flash ladar systems, "an all digital implementation of a detector array is not possible." U.S. Pat. No. 7,206,062 awarded to Asbrock, Dietrich, and Linder describes a readout integrated circuit adapted to process ladar return pulses by use of analog circuitry.

The present invention is a flash ladar camera system incorporating elements of the flash ladar technology disclosed in Stettner et al, U.S. Pat. Nos. 5,696,577, 6,133,989, 5,629,524, 6,414,746B1, 6,362,482, and U.S. patent application US 2002/0117340 A1, and which provides with a single pulse of light the range to every light reflecting pixel in the field of view of the ladar camera as well as the intensity of the reflected light.

SUMMARY OF THE INVENTION

The present invention comprises a flash ladar camera system with an optimized laser transmitter adapted to improve laser pulse shape and repeatability, reduce pulse timing jitter, and provide an amplitude corrected transmit timing reference. Additionally, the flash ladar camera of the instant invention makes use of digital signal processing techniques to improve reliability, repeatability, and thermal stability. The result of these improvements is an improved range accuracy of the flash ladar system.

BRIEF DESCRIPTION OF THE DRAWINGS

FIG. 1 is a system block diagram of the flash ladar camera system. The flash ladar camera system comprises a laser transmitter 1, camera receive optics 2, a system controller 3, an infrared optical receiver 4, and an image processor 5;

FIG. 2 is a block diagram of the side pumped variant of the Laser Transmitter denoted by the number 1 in FIG. 1;

FIG. 2A is a mechanical layout showing items of interest of the side pumped variant of the Laser Transmitter 1 shown in block diagram form in FIG. 2;

FIG. 2B is a diagram of illumination patterns produced by variations of the Diffuser denoted by the number 26 in FIG. 2;

FIG. 2C is a diagram of a gain guiding variant of the Q-switch denoted by the number 20 in FIG. 2;

FIG. 2D is a diagram showing mode suppressing features of the back facet mirror, and the Output Coupler denoted by the numbers 29 and 23, respectively, in FIG. 2;

FIG. 3 is a block diagram of the end pumped variant of the Laser Transmitter denoted by the number 1 in FIG. 1;

FIG. 3A is a mechanical layout showing items of interest of the end pumped Laser Transmitter 1 shown in block diagram form in FIG. 3;

FIG. 4 is a block diagram of the side pumped disc variant of the Laser Transmitter denoted by the number 1 in FIG. 1;

FIG. 4A is a mechanical layout showing items of interest of the side pumped disc variant of the Laser Transmitter 1 shown in block diagram form in FIG. 4;

FIG. 5 is a block diagram of the infrared optical receiver denoted by the number 4 in FIG. 1;

FIG. 6 shows details of the ARC signal and the delayed ARC signal denoted by the numbers 69 and 71, respectively, in FIG. 5, and their coupling to the input of the APD focal plane array denoted by the number 73 in FIG. 5;

FIG. 6A shows an alternate embodiment of the ARC signal and the delayed ARC signal denoted by the numbers 69 and 71, respectively, in FIG. 5, and their coupling to the input of the APD focal plane array denoted by the number 73 in FIG. 5;

FIG. 6B shows another alternative embodiment of the ARC signal and the delayed ARC signal denoted by the numbers 69 and 71, respectively, in FIG. 5, and their coupling to the input of the APD focal plane array denoted by the number 73 in FIG. 5;

DETAILED DESCRIPTION OF A PREFERRED EMBODIMENT OF THE INVENTION

A preferred embodiment of the present invention, the Automatic Range Corrected (ARC) Flash Ladar is depicted in block diagram form in FIG. 1. The system is designed to produce a 3-dimensional image using a pulsed laser transmitter, an infrared focal plane array detector, and timing circuits associated with each pixel of the array detector. The ARC Flash Ladar is capable of producing range and intensity data for any object or scene within its field of view from a single pulse of Laser Transmitter 1, in conjunction with System Controller 3, and Infrared Optical Receiver 4. An optional Image Processor 5 produces object data and enhanced 3-D images. Receive Optics 2 are interchangeable conventional telescopic lenses adapted to a specific range and field of view and serve in the same manner as in an ordinary 2D still or motion camera. The shorthand terms "flash laser radar", and "flash ladar" may be used interchangeably herein to refer to Laser Transmitter 1, Receive Optics 2, System Controller 3, and Infrared Optical Receiver 4 collectively, and to their mutual operation.

Laser Transmitter 1 in FIG. 1 produces a high power, short duration laser pulse illuminating the field of view of the Receive Optics 2. The command to initiate the high power laser illuminating pulse is sent by the System Controller 3 to the Laser Transmitter 1 via bidirectional electrical connections 9. Laser Transmitter 1 also provides a much lower power optical sample of the output illuminating pulse as an Automatic Range Correction (ARC) signal to the Infrared Optical Receiver 4 via signal connections 7, which include a fiber optic cable 28 as shown in FIG. 2. This lower power sample of the high power output laser illuminating pulse serves as a way to firmly establish the zero time reference for all time of flight measurements required for distance estimation to any objects in the field of view of Receive Optics 2. A delayed copy of the ARC signal serves as a reference for the accurate measurement of the System Controller 3 master clock frequency, providing an opportunity for the System Controller 3 to adjust and correct the readout IC timing clock, or to calculate correction factors for the frequency variance.

Receive Optics 2 has an optical aperture and a focal length fixed in one position by an application specific telephoto lens, or alternatively, may have a variable focal length lens with motorized drive. Subsequent to the flash of the pulsed Laser Transmitter 1, reflected light from the scene in the field of view of the Receive Optics 2 enters the lens system as Received Light signal 15. Once the Received Light signal 15 is passed through the Receive Optics 2 lens system, it is properly conditioned for input to the Infrared Optical Receiver 4. This conditioned optical input signal is passed to the Infrared Optical Receiver 4 via optical connection pathway 12.

System Controller 3 is capable of operating either in a slave mode, or as master system controller. In a slave mode, the System Controller 3 receives control commands from an external controlling computer or master console via Status/Control electrical connections 13 and also provides camera status via these same bidirectional Status/Control electrical connections 13. As the master controller, System Controller 3 is capable of running the camera independently, updating the camera system status and providing these status data to external monitoring equipment via bidirectional electrical connections 13.

System Controller 3 is notified by the Receive Optics 2 of the position of its motorized zoom lens (ZOOM_STATUS) via bidirectional electrical connections 6. System Controller 3 then may issue commands (ZOOM_CTRL) to the Receive Optics 2 to move the zoom lens to a chosen position via bidirectional electrical connections 6.

In the slave mode, the System Controller 3 issues commands and receives status updates to Laser Transmitter 1, Receive Optics 2, Infrared Optical Receiver 4, and Image Processor 5 as described above, except the values for the commands are determined by an external computer or master control console.

Whether operating as a master controller or as a local controller slaved to an external master controller, System Controller 3 controls and initiates the pulsing of the Laser Transmitter 1 by sending a TX_PULSE signal via bidirectional electrical connection 9 to Laser Transmitter 1. The System Controller 3 also provides a system clock (SYS_CLK) to Laser Transmitter 1, Infrared Optical Receiver 4, and Image Processor 5 via bidirectional electrical connections 9, 10, and 11, respectively. When the Laser Transmitter 1 sends a pulse downrange upon command from System Controller 3, it feeds back to the System Controller 3 via bidirectional electrical connection 9 a digital electrical signal (FLASH_DET) derived from a sample of the Laser Transmitter 1 back facet mirror, which mirror serves as the rear boundary of the Nd:YAG laser operating at the characteristic 1064 nm wavelength. This optical output is converted by optical detector 31 in FIG. 2 into an electrical signal, and amplified and threshold tested against a preset value, giving an electrical logic signal indicative of the initiation of a laser flash. This FLASH_DET signal provides logic to turn off Diode Pump Lasers (18, 33 in FIG. 2) in the Laser Transmitter 1, and also gives an approximate zero time reference for the range counters which measure the range for any reflected portion of the transmitted laser pulse incident upon any one of the 16,384 pixels in a typical infrared focal plane array of Infrared Optical Receiver 4. System Controller 3 also provides camera status signals to, and receives control commands from, a supervising master controller or director via bidirectional electrical connections 13.

Once the initial flash of the Nd:YAG rod (19 in FIG. 2) has occurred, the front facet of the Q-switched pulsed laser is coupled to an Optical Parametric Oscillator (OPO denoted by the number 22 in FIG. 2), which converts the wavelength to the 1570 nm wavelength desired for scene illumination. Laser Transmitter 1 also provides an optical sample of the pulsed laser output to the Infrared Optical Receiver 4 via an optical cable (28 in FIG. 2). This optical sample from the front facet of the pulsed laser is provided by an optical pickup, and is the basis for the Automatic Range Correction (ARC) capability of the improved flash ladar camera. The ARC signal 28 may also be used to provide an improved zero time reference with lower timing jitter than the FLASH_DET signal derived from the back facet of the Nd:YAG laser rod, which signal may also be used to turn off the Diode Pump Lasers 18 and 33, eliminating the need for the FLASH_DET back facet signal. There are significant, and somewhat variable delays between the rising edge of the 1064 nm light pulse of the basic Nd:YAG rod 19 and the rising edge of the OPO 22 output at the transmission wavelength of 1570 nm. Use of the Laser Transmitter 1 front facet ARC signal 28 eliminates another source of timing jitter in the establishment of the zero time reference, and therefore improves the overall range accuracy of the flash ladar system. The ARC signal is also used to calibrate the readout IC timing clock, and is therefore critical in establishing and maintaining an accurate measurement of the elapsed time between transmit pulses and return light pulses reflected from objects in the scene. Additional detail regarding the functioning of the ARC signal is provided in the discussion associated with FIG. 5.

Infrared Optical Receiver 4 incorporates an Avalanche Photodiode Focal Plane Array detector (73 in FIG. 5) positioned at the focal plane of Receive Optics 2, and receiving light signals reflected from the scene illuminated by the Laser Transmitter 1 pulsed output. A typical APD array of the instant invention might have 128 rows of 128 individual pixel elements in a square arrangement. Each detector array element will have connection to a low noise amplifier and a threshold detector set at an appropriate level to recognize the presence of an object or reflective surface in the illuminated scene. Each detector will also have a counter which initiates counting at the time of the laser flash, indicated electronically by the Laser Transmitter 1 ARC signal 28. At the instant the threshold detector for a given pixel exceeds the preset level, a logic signal will be produced, locking in the value of the counter for the given pixel. In this manner, a range estimate can be made based on the counter value for a selected pixel (RDAT). The intensity data for the selected pixel is also stored as a series of analog samples associated with the selected pixel (IDAT). The System Controller 3 distributes a clock signal through bidirectional electrical connections 10 to the Infrared Optical Receiver 4 which is used by the counters associated with each pixel in the APD focal plane array to determine range. Alternatively, the readout IC (74, 76 in FIG. 5) may have an onboard oscillator, enabling it to measure range data independently of the system clock distributed by the System Controller 3.

System Controller 3 receives a ready signal (IPRO_RDY) from Image Processor 5 via bidirectional electrical connection 11 when it is has completed processing of the previous frame of video or still picture. The System Controller then issues a 3D_CONVERT command to Image Processor 5 when the Infrared Optical Receiver 4 outputs are ready. Image Processor 5 then receives raw range and intensity data (RDAT, DAT) from Infrared Optical Receiver 4 of the flash laser radar via electrical connections 14. Image Processor 5 uses various mathematical and logical algorithms to adjust and correct the raw range and intensity data. This corrected data may then be processed to produce object data in the form of vectors describing regular geometric shapes. Object Data is output through electrical connection 8. The corrected range and intensity data may also be output in the form of a series of still images, or as a moving picture (3D_Composite) via electrical connection 16.

FIG. 2 is a block diagram of the laser transmitter of a preferred embodiment denoted by the number 1 in FIG. 1. Shown is a high power diode pump laser 18 positioned on the long side of a solid state rod laser gain media 19. The high power laser light from Diode Pump Laser 18 is coupled through a companion rod lens (39 in FIG. 2A) to focus the light interior to Laser Gain Media 19. Positioned on an opposing side of the rectangular rod shaped Laser Gain Media 19 is another high power diode pump laser 33 coupled through a second companion rod lens (40 in FIG. 2A) to Laser Gain Media 19. Laser Transmitter Controller 35 receives a TX_PULSE command from System Controller 3 via bidirectional electrical connection 9 and applies large current pulses to both Diode Pump Lasers (L) 18 and (R) 33, which lase at 808 nm, via electrical connections 34. Laser Gain media 19 is Nd:YAG which absorbs photons at 808 nm from the left (L) and right (R) Diode Pump Lasers 18 and 33. The energy level of the laser gain media 19 continues rising until Q-Switch 20 starts to bleach. When Q-Switch 20 bleaches sufficiently, the single pass gain along optical axis OA 25 surpasses unity, and a lasing mode quickly builds up between the interior facet mirror of Output Coupler 23 and the back facet mirror 29. The front facet mirror 21 is typically 99% transmissive and the back facet mirror 29 is typically less than 1% transmissive at the 1064 nm lasing wavelength of Laser Gain Media 19. Front facet mirror 21 serves to contain the Diode Pump Laser 18 and 33 output light at 808 nm to the Laser Gain Media 19. Both back facet mirror 29 and front facet mirror 21 are greater than 99% reflective at 808 nm. Laser Gain Media 19 is split into two roughly equal halves, with an internal Brewster angle window (41 in FIG. 3) which serves to couple any horizontally polarized light out of the Laser Gain Media 19. This removal of horizontally polarized light conditions the laser pulse appropriately for the frequency conversion process in Optical Parametric Oscillator 22.

Laser light at 1064 nm exiting through the front facet mirror 21 of Laser Gain Media 19 is incident upon Optical Parametric Oscillator 22, a non-linear doped KTP (Potassium Titanium Oxide Phosphate) crystal which serves to convert the incident 1064 nm laser radiation into a 1570 nm light pulse directed along optical axis OA 25. Front facet mirror 21 is also greater than 99% reflective at 1570 nm, and serves to confine the frequency converted output of the OPO between Front Facet mirror 21 and the Output Coupler 23 exterior mirror surface. Output Coupler 23 exterior facet mirror surface is typically 70% reflective at the nominal 1570 nm lasing wavelength of Laser gain Media 19. The Output Coupler 23 interior facet mirror surface stops the transmission of the shorter wavelength 1064 nm light and serves as the resonator mirror for the 1064 nm lasing mode. The front, or exterior surface mirror of Output Coupler 23 passes approximately 30% of the light at the converted wavelength near 1570 nm as the output pulse of Laser Transmitter 1. As noted, the exterior surface mirror of Output Coupler 23 is typically 70% reflective, which provides enough reflected 1570 nm light to the OPO 22 to provide for efficient wavelength conversion in the OPO 22. Light pulses exiting the front surface of Output Coupler 23 along optical axis OA 25 are incident upon Diffuser 26, which diffuses the high intensity laser radiation into a square, top-hat shaped output beam designed to uniformly illuminate the entire scene in the field of view of Receive Optics 2 along the optical axis 25. Diffuser 26 is a diffractive optic, commonly referred to in the literature as a holographic diffuser, and is designed to project the Laser Transmitter 1 output beam in the desired pattern. Diffuser 26 may also be a conventional refractive lens element. Receive Optics 2 is positioned in a slightly offset position from Laser Transmitter 1 and boresighted in the same direction along Optical Axis OA 25 and held in position by the flash ladar camera body.

Other materials may be substituted for Nd:YAG as the Laser Gain Media 19 such as Yb:YAG, Yb:Er:YAG, Er:Glass, etc. while maintaining the advantages of the instant invention. Other rod geometry, such as circular, elliptical, or hexagonal, may be used for the Laser Gain Media 19 and associated elements of Laser Transmitter 1. Other crystals may be used for the OPO 22 such as $KTiOAsO_4$ (KTA) in order to improve performance, or generate other wavelengths more suited to flash ladar operation in underwater environments, or in the presence of fog, dust, or other atmospheric obscurants. Additionally, other adaptations of Diffuser 26 may be beneficial to effect other than a square "top hat" output beam. It may be desirable to shape the Diffuser 26 to produce an output beam with a power density greater in the center than at the sides, to enhance distance viewing in the center of the field of view, or to direct the main focus of the beam energy at a desired angle. For such applications, a non-uniform beam profile, or otherwise shaped beam output may be produced by an aspherically lensed Diffuser 26. These and other adaptations of the preferred embodiment described herein may be practiced without changing the nature or effect of the instant invention, or the associated claims.

FIG. 2B shows a number of illustrative beam profiles which may be effected by Diffuser 26. Shown at the top left of FIG. 2B is a Lambertian, or uniform optical power density profile 96 covering a full 180°. The plot is shown in the horizontal plane, or the $\ominus$-plane, in spherical coordinates. This profile can be achieved using a hemispherically shaped lens as a Diffuser 26. At the bottom left of FIG. 2B, a truncated Lambertian pattern is shown, which describes a uniform optical power density pattern 99 which is limited by first limiting angle 97 at −60° and second limiting angle 98 at +60° in the example shown, for a total angular coverage of 120°. At the top right of FIG. 2B a truncated and rotated Lambertian pattern 101 is shown which provides uniform optical power density over a 90° field of view, which has been rotated 45° by rotation angle 100 in the example shown.

Finally, at lower right of FIG. 2B is shown a combination pattern termed Forward Moving illumination pattern 105, which is conditioned for application to moving vehicles. Of primary concern to an automobile, airplane, train, trolley, robotic crawler, or other moving platform is the need to avoid collisions with stationary or moving objects directly in the path of the moving vehicle, but it is also necessary to have some ability to sense nearby objects close to the operational path of the vehicle if the vehicle is turning or maneuvering. The need therefore, is to sense objects directly in the path of the vehicle at a greater distance, and to project a greater power in the narrow path directly in the path of the vehicle, and project a reduced power pattern lateral to the path of the vehicle to sense nearby objects which may interfere with the lateral progress of the vehicle. The Forward Moving illumination pattern 105 is a uniform, or Lambertian pattern with a reduced power level 106 in the sidelobes of the radiation pattern, combined with a truncated Lambertian pattern with increased power level 104, in the region between first limiting angle 102 and second limiting angle 103. Each of the above described radiation patterns may also be achieved in elevation, or $\psi$-plane as well as the horizontal $\ominus$-plane as shown. In addition, the profiles in the $\psi$-plane and the $\ominus$-plane do not have to match, and the radiation profile may be shaped as necessary to provide the exact coverage required by the particular application.

Diffuser holder 24 also serves to couple a portion of the output laser light pulse into optical cable 28 via fiber optic connector 27 and connector ferrule 17, also shown in FIGS. 2 and 2A. The polished end face of fiber optic connector ferrule 17 positioned at a right angle to optical axis OA 25 receives adequate energy from each outgoing laser pulse to provide Infrared Optical Receiver 4 with the necessary optical signal to establish a stable and accurate zero time reference, and to derive clock timing information as well. Connector body 28 is typically an "FC" type, with a threaded body ideal for inserting into a mating hole, counterbored and tapped, in Diffuser holder 24. The polished endface of connector ferrule 17 of the "FC" style fiber optic connector 27 exposes the active region of an optical fiber which serves as an optical pickup, sampling the outgoing laser illuminating pulses as they pass through Diffuser 26 along optical axis line OA 25. This optical sample of the outgoing laser illuminating pulse is provided to the Infrared Optical Receiver 4 as the Automatic Range Correction (ARC) signal via optical cable assembly 28 comprised of cable 28 and connectors 27 as one of the connecting elements of interconnections (7 of FIG. 1) between Laser Transmitter 1 and Infrared Optical Receiver 4.

When the laser pulse starts to rise, the light output at 1064 nm incident on the back facet mirror 29 of the Nd:YAG laser impinges upon optical pickup 31. Optical pickup 31 may be an exposed ferrule of an optical connector similar to optical connector 27. Optical Pickup 31 is then connected to the Laser Transmitter Controller 35 through connection 32 which is a fiber optic connector in the case where Optical Pickup 31 is an exposed ferrule of a fiber optic connector. Inside the Laser Transmitter Controller 35, a photodetector diode terminates the fiberoptic cable and converts the signal thereon into an electrical signal which is then passed through an amplifier and threshold voltage detector as described previously herein. This detected, amplified, and threshold tested signal indicates the onset of a laser pulse in Laser Gain Media 19, and is labeled as FLASH_DET. The FLASH_DET signal is normally used by Laser Controller 35 to terminate the current supply to Diode Pump Lasers 18 and 33 to avoid a double pulse output from the Laser Transmitter 1.

Alternatively, Optical Pickup 31 may be a photodiode positioned to intercept a portion of the light pulse incident upon the rear facet mirror 29 of the Nd:YAG laser, in which case connection 32 is an electrical connection comprised of stranded or solid wire, or in a further embodiment, a flex circuit connecting electrically to the Laser Transmitter Controller 35.

Laser Transmitter Controller 35 also monitors the magnitude and duration of the currents supplied to the Diode Pump Lasers 18, and 33 and reports these values to any supervising external controller as part of the Laser Transmitter 1 status data as Operating Parameters. Additionally, Laser Transmitter Controller 35 monitors temperature data for the Diode Pump Lasers 18 and 33 as well as Laser gain Media 19, and reports these laser transmitter status data as Laser Temperatures (3). Laser Transmitter Controller 35 also provides the FLASH_DET signal as a system status output to any external supervising controller. Based on the values of the temperature data for each of the Diode Pump Lasers 18 and 33, and the Laser Gain Media 19, Laser Transmitter Controller 35 calculates and applies a forward or a reverse current to TE Cooler 36, causing it to cool or heat the common heatsink 42 in FIG. 2A. By cooling or heating the common heatsink 42, Diode Pump Lasers 18 and 33 are kept within safe zones and at the proper operating wavelength for optimal absorption by Laser gain Media 19. Heatsink 42 also serves as the alignment mechanism for all the constituent optical components of the Laser Transmitter 1 of FIG. 2A, enabling a "monoblock" design. Heatsink 42 may be a flat ceramic substrate of Beryllium Oxide, Aluminum Nitride, or of a metallic material such as Kovar. The advantages of the "monoblock" design include better alignment stability, ease of manufacturing, and thermal performance. The substrate material which heatsink 42 is formed from is nominally matched thermally to the expansion coefficient of the Laser Gain Media 19, and may contain raised features 44, V-grooves, U-shaped channels, or etched or mechanically polished features (not shown) to aid in the initial alignment of the constituent optical elements of Laser Transmitter 1 during assembly. The various optical elements of the Laser Transmitter 1 are mechanically retained by the common heatsink 42 using epoxy or adhesive, or by a deformable heat conducting compressible tape or mechanical spring elements, acting in concert with optical confinement cover 43. Similar mechanical constructs act to retain the optical elements of the end pumped Laser Transmitter 1 of FIGS. 3, 3A and the thin disc Laser Transmitter 1 of FIGS. 4, 4A.

The difficulty in accurately predicting the onset of a laser pulse has been previously described. This difficulty is a result of the variable electrical-to-optical efficiencies of Diode Pump Lasers 18 and 33, their initial wavelength match to the Laser Gain Media 19 absorption curve, their wavelength drift versus the Laser Gain Media 19 absorption curve, spatial variations of the Laser Gain Media 19, and spatial variations of the Q-Switch 20 absorption and bleaching rates, for example. In order to overcome these temporal variations affecting the onset of lasing in Laser Gain Media 19, Laser Transmitter Controller 35 creates a Fire current pulse which turns on Q-Switch Trigger Laser 30. The Fire current pulse is appropriately timed to occur slightly before the onset of lasing would occur naturally from the bleaching of Q-Switch 20. In effect, Q-Switch Trigger Laser 30 creates the bleaching of Q-Switch 20 prematurely, albeit in a preferred location within Q-Switch 20, and at a controlled and repeatable interval calculated and determined by Laser Transmitter Controller 35.

Q-Switch Trigger Laser 30 is typically a semiconductor laser and may have a wavelength anywhere in the absorption band of Q-Switch 20. The wavelength of Q-Switch Trigger Laser 30 is chosen in a tradeoff between available power, ease of coupling, and initial cost, and may be anywhere in the range of 750-1570 nm. The entire Laser Transmitter 1 assembly is covered by a white anodized aluminum optical confinement cover 43 in FIG. 2A, which serves the dual purpose of increasing overall efficiency by reflecting stray light back into the Laser Gain Media 19, and preventing any potentially unsafe levels of near IR laser light to be viewed directly by an operator.

The lowest order propagating mode (fundamental cavity mode) is the axial mode directly along optical axis OA 25. This mode has the lowest temporal dispersion, and would be most desirable from a system operations point of view, if it could be maintained uninterruptibly during an output laser pulse from Laser Transmitter 1. Higher order modes are those which propagate in the outer reaches of Laser Gain Media 19 in a parallel configuration (zero degree angle) to the fundamental mode, and those modes bound by the cavity which propagate at a non-zero angle to optical axis OA 25. It is precisely these higher order modes which create temporal dispersion of the Laser Transmitter 1 pulse output. In the case of the parallel rays, non-uniformities in the Q-Switch 20 may cause modal partitioning noise, as the Q-Switch 20 bleaches laterally from a local absorption minima in the Q-Switch 20 material, to a local energy maxima caused by Diode Pump Lasers 18, 33, or in the reverse order. Off-axis modes may exit the Laser Gain Media 19 at higher angles, and therefore exhibit path-length based dispersion due to transit time within Laser Gain Media 19, as well as dispersion based on spherical aberrations associated with optical elements in the optical path. The Side Pumped Laser Transmitter 1 of FIG. 2 exhibits a number of issues related to the preferential excitation of these higher order modes.

Because the cross section of Laser Gain Media 19 is a rectangular or circular rod, Diode Pump Laser 18, 33 light is absorbed near the outer (lateral or radial) surfaces of Laser Gain Media 19, producing exactly the kind of elevated energy levels which result in bleaching of the Q-Switch 20 at local energy maxima along one or both of the long sides of Laser Gain Media 19. By adding rod lenses 39, 40 as shown in FIG. 2A, the energy of Diode Pump Lasers 18 and 33 can be more uniformly distributed, and focused internal to the Laser Gain Media 19, preferably on or near Optical Axis 25. Rod lenses 39 and 40 increase the images of the small spot sizes of Diode Pump Lasers 18, 33 making a more uniform illumination pattern, reducing the potential for local energy maxima, and together create a convergence of Diode Pump Laser 18, 33 light on or near Optical Axis OA 25 near the center of rod shaped Laser Gain Media 19. The net effect is an improvement of temporal pulse shapes.

Further improvements to the temporal pulse shapes of the Side Pumped Laser Transmitter 1 of FIG. 2 involve other methods of preferentially pumping or exciting the lowest order laser propagating modes, and suppressing the propagation of higher order modes unintentionally excited by the Diode Pump Laser 18, 33 coupling scheme. Shown first in FIG. 2C is an improvement to Q-Switch 20 which creates an absorption profile increasing with radial distance from Optical Axis OA 25. Q-Switch 20 is shown in a circular rod configuration, as opposed to the rectangular rod configuration of the preferred embodiment, though the absorption profiling method may be used to adapt either geometry with beneficial effect. Q-Switch 20 is sliced from a Chromium doped cylindrical Nd:YAG rod which has a baseline as-grown doping level 108 of 1%. The rod is then spin-coated with a liquid bearing a high concentration of Chromium and placed in a diffusion furnace. The Chromium doped Nd:YAG rod is then subjected to a thermal profile tailored to create the doping profile 96 shown in FIG. 2C. This Gain Guiding Q-Switch 20 of FIG. 2C overcomes some of the limitations associated with the Side Pumped Laser Transmitter 1 of FIG. 2, 2A described above. The doping profile 96 is generally an exponential, though the shape is not critical, and the baseline 1% doping level 108 and the peak doping level 107 of 2.5% may be varied within the scope of the instant invention. Shown in FIG. 2D is a second improvement to the Side Pumped Laser Transmitter 1 of FIG. 2, 2A designed to suppress higher order modes unintentionally excited by the Diode Pump Laser 18, 33 coupling scheme. Back Facet Mirror 29 has been modified to have a converging surface 97, with steeper sides and a substantially flat surface in a central region close to Optical Axis OA 25. The converging surface 97 of Back Facet Mirror 29 may be conical, spherical, or of a parabolic shape without deviating from the intent or teaching of the instant invention. Similarly, the interior mirror surface 99 of Output Coupler 23 may be shaped convergently to suppress the higher order propagating modes unintentionally excited by the coupling scheme of Diode Pump Lasers 18 and 33. Shown at the right of FIG. 2D is the modified Output Coupler 23 with convergent interior mirror surface 99 showing a central region 98 which is substantially flat. The shape of Output Coupler 23 interior mirror surface 99 may be conical, parabolic, or spherical, or aspherical without deviating from the intent or teachings of the instant invention.

FIG. 3 shows an alternate embodiment of Laser Transmitter 1. In this version of Laser Transmitter 1, the diode pump lasers have been consolidated into a single Diode Pump Laser module 37 which is coupled to the back facet mirror 29 of Laser Gain Media 19 through Index Guiding Taper 38. The back facet mirror 29 has been modified to have a greater than 99% transmissivity at the 808 nm wavelength of Diode Pump Laser module 37, while maintaining a greater than 99% reflectivity at the 1064 nm wavelength of Nd:YAG Laser Gain Media 19. This manner of pumping the Laser Gain Media 19 is capable of producing a number of benefits. Because the interaction length of the Diode Pump Laser light output with the Laser Gain Media 19 is much greater than in the side pumped configuration of FIGS. 2, 2A, there is less of a need to stabilize the wavelength of Diode Pump Laser 37. The interaction length for the pump light with the lasing media can be as great as 50 mm in the end pumped configuration, as opposed to less than 5 mm in the side pumped configuration of FIG. 2, 2A. Therefore, the elimination of Thermoelectric Cooler 36 in FIGS. 2, 2A is possible, and at a great benefit to the overall design, because of the inefficiencies associated with TE Cooler 36. The peak efficiency of the TE Cooler 36 is approximately 40%, and in most conditions is closer to 25%. This efficiency rating means the Laser Transmitter 1 of FIG. 2 must dissipate at minimum 2.5 times the power dissipated by the Diode Pump Lasers 18 and 33 of FIG. 2, a power requirement which taxes the system power supply (not shown) and limits the operating temperature profile of the assembled Laser Transmitter 1 of FIGS. 2, 2A to a typical range of 0-40 degrees Centigrade. By eliminating the TE Cooler 36 of FIG. 2, the End Pumped Laser Transmitter of FIG. 3 power consumption is dramatically reduced, and the Laser Transmitter 1 shown in layout form in FIG. 3A can then be operated over a temperature range of −20 to 70 degrees Centigrade.

Diode Pump Laser 37 is an assemblage of a number of linear diode arrays, normally attached to a common ceramic or metallic heatsink 45 in FIG. 3A. The output light from Diode Pump Laser module 37 is coupled to the Laser Gain Media 19 back facet mirror 29 via Index Guiding Taper 38, which collects all the available pump diode light and guides it to the back facet mirror 29 of Laser Gain Media 19 while simultaneously tapering the mode field diameter in two dimensions. The reduced mode field diameter facilitates better temporal waveshapes in the Laser Transmitter 1, by preferentially exciting the lower order cavity modes of Laser Gain Media 19, which modes exhibit lower temporal dispersion than the higher order cavity modes preferentially excited in the side pumped configuration of FIGS. 2 and 2A. A refractive optic may be used in lieu of Index Guiding Taper 38 with similar beneficial effects, though with a slightly less efficient optical coupling.

FIG. 3A shows the physical layout of the end pumped variant of Laser Transmitter 1 shown in block diagram form in FIG. 3. Notably, the form factor is longer and narrower compared to the side pumped Laser Transmitter 1 of FIG. 2A. Index Guiding Taper 38 can be seen to have a taper in both vertical and horizontal planes, while many other features common to the basic structure of FIGS. 2 and 2A remain unchanged. Both the Gain Guiding Q-Switch of FIG. 2C and the Mode Suppressing Mirrors of FIG. 2D may be used to improve and enhance the spatial and temporal characteristics of the End Pumped Laser Transmitter 1 of FIGS. 3, 3A.

FIG. 4 shows a further development of Laser Transmitter 1 in block diagram form. The Side Pumped Disc Laser Transmitter 1 of FIG. 4 is shown in layout form in FIG. 4A for key elements of the design and will be described in tandem with FIG. 4 herein. Examining FIG. 4, it can be seen the complexity of the design is reduced dramatically. Diode Pump Lasers 18 and 33 are now complemented by an additional six (6) diode pump lasers 59-64, on three new axes as can be seen in FIG. 4A for a total of eight (8). A smaller number of diode pump lasers will also work, down to a minimum of two, but six to eight has been determined to be an optimum number for the purposes of this design. Shown in the diagram of FIG. 4A is an octagonally shaped thin disc Laser Gain Media 50, but other disc shapes may be used with similar benefits such as: hexagonal, circular, elliptical, or any regular polygon with a number of sides. The intersection of the optical pump energy for these eight Diode Pump Lasers 18, 33, and 59-64 of FIGS. 4, 4A, creates a local maximum of excited states in a central region (56 in FIG. 4A) at the center of the Laser Gain Media 50 which coincides with front facet mirror region 49 and rear facet region 57. The side pumped disc Laser Transmitter 1 embodiment of FIGS. 4, 4A, utilizes a different Laser Gain Media 50 comprised of Erbium doped Phosphate glass, or Er:Glass. The lasing wavelength of the Er:Glass gain media is centered around 1540 nm, which is at or near the desired wavelength for eye safety, propagation, and detector sensitivity. Because the wavelength of Laser Gain Media 50 is at the fundamental wavelength desired, there is no need for a secondary wavelength conversion, and thus the OPO 22 of FIGS. 2, 2A, and 3, 3A is eliminated. The elimination of the OPO (22 in FIG. 2) is of considerable benefit because the efficiency of the wavelength conversion process may only be 50%, resulting in a large power penalty to both the side pumped and end pumped rectangular rod laser designs of FIGS. 2 and 3. Traded off against the improved efficiency possible due to the elimination of OPO 22 is the reduction in optical efficiency of the Erbium glass Laser Gain Media 50 of the Disc Laser Transmitter 1 versus the Neodymium:YAG Laser Gain Media 19 of the side or end pumped Laser Transmitter 1 of FIGS. 2, 2A, 3, and 3A. Therefore, though the overall electrical-to-optical efficiency may be little changed, the benefits of single mode output and a self aligning structure may be considered decisive improvements of the geometry of Side Pumped Disc Laser Transmitter 1 of FIGS. 4, 4A.

The material composition for Q-Switch 20 may also be altered to better match the operating wavelength of 1540 nm because the Q-Switch 20 is now operating in an environment where it is working with the fundamental transmission wavelength of 1540 nm of the Laser Gain Media 50, rather than the basic wavelength of 1064 nm of the Nd:YAG media of previous FIGS. 2 and 3. Shown schematically in FIG. 4 is the back facet mirror 58 with rear facet region 57. Light entering the cavity from the radially arranged Pump Laser Diodes 18, 33, 59, 60, 61, 62, 63, and 64 laterally along axis B-B in FIG. 4A is absorbed by Laser Gain Media 50. The light may be conditioned by an optional lensing element such as rod lens 55 illustrated in profile in FIG. 4A in the Right Side View. Lensing and waveguide apparatus are interchangeable in this role, both capable of conditioning the light from the Diode Pump Lasers 18, 33, and 59-64, to create a desired illumination profile, and either may be used. As energy builds up in the Er:Glass Lasing Media 50, some premature stimulated emission may take place in the outer regions where back facet 58 is sloped as shown clearly in FIG. 4A Right Side View. Back facet mirror 58 is reflective at both the 976 nm wavelength of Diode Pump Lasers 18, 33, and 59-64, and at the desired lasing wavelength of 1540 nm, and may be a multilayer dielectric coating, or may also be a simple reflective metallic coating, such as aluminum, silver or gold. The sloping back facet mirror 58 gently guides any premature stimulated emissions towards the central region 56 shown in FIG. 4A. These premature stimulated emissions might otherwise build up into self sustaining lasing modes, which could theoretically rob the central region 56 of some of the energy designed to be radiated through the partially reflective central region front facet mirror 49. At the center of sloping back facet mirror 58, a flat mirror region 57 creates an ideal lasing cavity structure together with Laser Gain Media 50, Q-Switch slab 20, and partially reflective front facet mirror 49 disposed over central region 56. While the back facet mirror 58 of the preferred embodiment is linearly tapered, other convergent shapes are anticipated which will have similar benefits to the design. Convergent mirror shapes which are parabolic, spherical, or aspherical are anticipated, and are expected to show improved performance. The sloped, or conically tapered back facet mirror 58 has been chosen for simplicity of fabrication and assembly. Partially reflective front facet mirror 49 in the central region has a reflectance in the range of 20-98%, depending on the desired pulse power and duration. The remainder of the front facet mirror 47 outside the central region is of the highest reflectivity as is practical, and is typically greater than 99% reflective.

In operation, Diode Pump Lasers 18, 33, and 59-64 receive a current pulse from Laser Transmitter Controller 35 and begin to pump Laser Gain Media 50 with 976 nm laser light. Because the thin disc Laser Gain Media 50 typically has a diameter of between 2 and 10 centimeters, the interaction length between the Diode Pump Lasers 18, 33, and 59-64 is great enough so the wavelength of the Diode Pump Lasers 18, 33, and 59-64 does not need to be closely controlled. This long interaction length means there is no need to provide active temperature control to Diode Pump Lasers 18, 33 and 59-64. The 976 nm pump light is contained within the Laser Gain Media 50 by intracavity mirror 46 which is highly reflective at 976 nm, typically greater than 99% reflective at 976 nm. Intracavity mirror 46 is also as highly transmissive as possible at the 1540 nm wavelength of Laser Gain Media 50, typically 99% transmissive. As energy levels rise within the Er:Glass Laser Gain Media 50, some stimulated emissions begin to occur, and may cause bleaching of Q-Switch slab 20 in outer regions of the device, close to the Diode Pump Lasers, and distant from the central region 56. Because of the sloping back facet 58 in these outer regions, no self-sustaining laser modes at the 1540 nm wavelength can arise. The 1540 nm light emissions in these outer regions are gently guided toward central region 56 where they sum with the light from the other pump sources at 976 nm and with any other premature 1540 nm light to create a region with the highest density of excited states within the Laser Gain Media 50. Because the mirror surface 57 in the central region of back facet mirror 58 is flat, a self-sustaining lasing mode may arise once Q-Switch 20 bleaches in the region described by the dashed lines in FIG. 4A Right Side View, the central region 56. Because of the ultrashort cavity length in the range of 150-450 micrometers, only a single wavelength will be selected which overlaps the gain profile of Er:Glass doped Laser Gain Media 50, and thus will be established a single longitudinal mode (ray 65 shown exiting the laser at 49) in the central region 56 of the Side Pumped Disc Laser shown in FIGS. 4, 4A. Once a single longitudinal mode 65 along optical axis OA 25 is set up, a single transverse mode 66, showing a nearly Gaussian profile will also be set up, illustrated at the top right of FIG. 4A. Side Pumped Disc Laser Transmitter 1 may also make use of the radially tapered Q-Switch 20 absorption profile described in association with FIG. 2C, in order to reduce the probability of exciting higher order modes in Laser Gain Media 50, which could potentially rob the device of power in the desired central region 56 by siphoning off energy to feed parasitic modes outside this central region 56.

Fiber optic connector 31 is in contact with an opening in the common heatsink 53 and penetrates the back facet mirror surface at or near the center of the flat mirror surface 57, substantially aligned with optical axis OA 25. Heatsink 53 may be of ceramic or metallic materials, designed to remove heat and retain the optical elements in alignment. The polished end of the ferrule projecting from the "FC" connector body 31 of the preferred embodiment may act in one of two capacities. First, it may serve to couple an optical sample of the output laser pulse back to the Laser Controller 35 through fiber optic cable 32 as an ARC signal as described above in connection with FIGS. 2, 2A. Second, it may serve as the initiation point for "seeding" the laser mode at the center of the side pumped disc Laser Transmitter 1 along optical axis OA 25. Seeding the laser mode along optical axis OA 25 may be accomplished by using the fiber optic cable 32 and fiber optic connector 31 to couple a lower power laser output from a semiconductor laser (not shown) triggered by a Fire pulse from Laser Controller 35. The Diffuser 26 and Diffuser holder 24 may still be used in association with fiber optic connector 27 and ferrule 17 to produce an ARC signal from the front of the laser as previously described. However, in some cases, it may be useful to have two fiber optic cables and connectors 31, 32 positioned at the rear of the laser close to optical axis OA 25 as shown, using one to create an optical ARC signal, and the other to preferentially seed the fundamental axial mode 65 of the side pumped disc Laser Transmitter 1 of FIGS. 4, 4A. It is well known in the art if a single longitudinal lasing mode with a single transverse Gaussian power spectral density profile 66 is obtained, excellent temporal pulse behavior will be the result. As such, this side pumped disc Laser Transmitter 1 is capable of providing the greatest of benefits to the flash ladar of the instant invention. The ensuing discussion of Infrared Optical Receiver 4 will illustrate the benefits of the various improvements described above in the discussion of FIGS. 2, 2A, 3, 3A, 4, and 4A.

FIG. 5 shows the infrared optical receiver 4 in block form. Receive optics 2 comprised of a fixed lens 88 and optional motorized zoom lens 87 intercepts a portion of the transmitted laser pulse reflected from the scene in the field of view as Received Light 15. This light signal is conditioned and directed to fall as a focal plane array input 67 on receive sensor front end 72 which is comprised of a 128×128 focal plane array of APD optical detectors 73 in the preferred embodiment. APD Focal Plane Array 73 sits atop Readout IC 76 which has a Front End section 74. Front End section 74 consists of an array of individual electrical circuits termed unit cells. Each unit cell has an input connected to one of the pixels of the APD Focal Plane Array 73, and typically, each pixel of APD Focal Plane Array is connected to an input of a unit cell. Each unit cell typically contains a low noise amplifier with variable gain, a threshold detecting circuit, a timing circuit, and a sampling circuit. The operation of the unit cell circuitry has been detailed in prior art patents U.S. Pat. No. 6,133,989, U.S. Pat. No. 5,696,577, U.S. Pat. No. 6,414,746, and U.S. Pat. No. 6,362,482 B1, which are incorporated herein by reference. The outputs of the individual unit cells are selected by the System Controller 3, and the data read out sequentially. The data for each pixel read out by System Controller 3 typically consists of an analog value representing the intensity of the light received by the pixel (or a digital representation thereof), the time of arrival of the light pulse received by the pixel, and in some cases, a series of analog samples (or digital representations thereof) representing the shape of the received light pulse.

Drive electronics 75 produce a ZOOM_DRIVE output capable of driving the motorized zoom lens 87 of the receive optics 2 and transmits this drive signal to the zoom lens via bidirectional electrical connections 85. Drive electronics 75 also reads the shaft encoders or optical encoders indicating position of the zoom lens via bidirectional electrical connections 85 and produces a RX_ZOOM_STATUS signal for communicating Infrared Optical Receiver 4 status signals to System Controller 3 through bidirectional electrical connection 84. Infrared Optical Receiver 4 status signals 79 are bundled with Infrared Optical Receiver 4 control signals 78 and bidirectional electrical connections 84 and shown together as bidirectional electrical connections 10 between Infrared Optical Receiver 4 and System Controller 3 in FIG. 1. Bidirectional electrical connections 10 also serve to connect the ZOOM_CTRL signal from System Controller 3 to Drive Electronics 75.

Drive Electronics 75 also receives control commands from System Controller 3 intended for Receive Sensor Front End 72 including ZERO_REF timing information, transmitted pulse shape coefficients, system clock, calibration factors, etc., necessary for operation of the Receive Sensor Front End 72 via bidirectional electrical connections 10. These signals are passed between Drive Electronics 75 and Receive Sensor Front End 72 via bidirectional electrical connections 86. The Drive Electronics 75 also generate the APD Focal Plane Array 73 bias voltage, and provides this voltage to Receive Sensor Front End 72. Drive Electronics 75 also receives numerous status signals from Receive Sensor Front End 72 via bidirectional electrical connections 86. Drive Electronics 75 also controls the timing of the transfer and conversion of raw data from the Receive Sensor Front End 72 to Output Electronics 80. These raw data are transferred via electrical connections 77 by controlling Output Electronics 80 through electrical connections 83 while simultaneously controlling Receive Sensor Front End 72 via bidirectional electrical connections 86. Portions of the Readout IC (ROIC) responsible for global functions of the ROIC 76, including the logic circuits which control the selection of the row and column of the ROIC Front End 74 individual pixel output amplifiers, also reside within Drive Electronics 75 mounted on printed circuit board assembly 81.

Receive Sensor Front End 72 provides range and intensity data to the Output Electronics 80 via electrical connection 77 when polled at the end of a laser pulse transmit cycle. A typical frame rate of 30 Hz allows for 33 mS between laser transmit pulses, which means there is ample time for the internal range gate to time out, and for the Output Electronics 80 of Infrared Optical Receiver 4 to readout the raw range and intensity data from the Receive Sensor Front End 72, make its calculations, and transmit these calculated or reduced data via its electrical output 82 which is bundled together with other Infrared Optical Receiver 4 outputs as electrical connections 14 in FIG. 1. Given a maximum range of 10,000 feet, the range gate can close after 20 microseconds (representing a two-way trip), and no further reflected pulse should be expected. The Output Electronics 80 makes calculations based on the raw analog samples of the received light pulses to accurately fit the centroid of the transmitted laser pulse, or a leading edge of the transmitted pulse, or some kind of a least squares or exponential curve fit of the transmitted illuminating pulse shape, allowing for a more precise estimate of time of arrival of the reflected laser pulse signal 15, and therefore a more precise measurement of the range datum indicated by the reflected laser pulse 15. These pulse shape fitting calculations are done for each pixel of the 16,384 pixels of the 128×128 focal plane array (FPA) of the preferred embodiment. The Output Electronics 80 also adjusts analog values of reflected pulse amplitude for any DC offsets or gain variance before passing these signals to an internal analog to digital converter. The corrected and adjusted digital representations of range and intensity are then transmitted via electrical connections 14 either to an internal Image Processor 5, or directly to an external display or image processing function.

Output Electronics 80 also receives calibration data from System Controller 3 related to the offset and gain of the track and hold amplifiers driving the input to the analog to digital converter (ADC) of Output Electronics 80 via signal line 78 and returns status information to the system controller 3 via signal line 79. Both signal lines 78 and 79 are bundled with bidirectional electrical connections 10 between infrared optical receiver 4 and system controller 3.

It is important to note the effect of the improvements to the Laser Transmitter 1 pulse timing and pulse shape as they affect the distance measuring capacity and accuracy of Infrared Optical Receiver 4. The estimation of the time of arrival of a reflected light pulse returned from the scene in the field of view of the flash ladar camera is negatively affected by transmitted laser pulses which have poor conformance to a regular Gaussian, exponential, or polynomial mathematical representation. Poor conformance of a transmitted laser illuminating pulse to a regular mathematical function can create timing uncertainties, because the received light pulses are converted into a series of samples and processed to extract timing data by means of a data reduction. The reduction of the received pulses is an attempt to fit each return pulse shape to a given characteristic transmit pulse shape, typically using a polynomial, series, rational function, centroid, Gaussian, exponential, or some novel combination from this list, which fits the sampled curve with a number of terms to the chosen function, usually employing less than nine (9) terms. Therefore, the improvements to Laser Transmitter 1 pulse shape which reduce output pulse-to-pulse timing jitter, eliminate splitting of the transmit pulse shape, and/or improve conformance of the transmitted pulse shape to a Gaussian characteristic, improve the distance accuracy of the Infrared Optical Receiver 4 by improving the certainty of the time of arrival of the reflected light pulses.

The ARC system is a further attempt to improve the accuracy of the flash laser radar of the instant invention. The optical sample of the Laser Transmitter 1 output transmitted by the ARC signal cable (28 in FIG. 2, or 32 in FIG. 4A) is provided to the Infrared Optical Receiver 4 and to optical coupler 68 as shown in FIG. 5, where it is split into two equal power level optical signals 69 and 71. The optical signal 71 which is fed to APD Focal Plane Array 73 is delayed by fiber optic delay line 70, which is a coil of bare optical fiber between 50-100 meters in length. Both the delayed 71 and undelayed 69 optical signals are physically coupled to the input of two side-by-side pixels at a corner of the APD Focal Plane Array 73 by an ARC pixel coupling structure as shown in FIG. 6. By sending an undelayed optical sample 69 of the transmit pulse through a sacrificial pixel of the APD Focal Plane Array (FPA) 73 and associated ROIC Front End amplifier, the time delays common to each of the individual APD detectors in the FPA 73 and their associated low noise amplifiers contained in ROIC Front End 74 can be duplicated and then nulled out by globally subtracting the time delay measured on the pixel which is illuminated by the ARC signal 69 as an initial offset adjustment. This effectively improves the quality of the zero time reference, which is a basis for all of the time delay measurements for all of the pixels of the entire APD FPA 73, and therefore improves the accuracy of all of these range measurements.

By using the delayed branch of the ARC signal 71, a calibration of the timing clock which is the global reference oscillator for all of the counters associated with each pixel of the APD focal plane array is made possible. Major portions of the timing clock may be embedded in ROIC 76. This timing clock may operate independently, or may be slaved to the system clock provided by System Controller 3. Calibration of the timing clock allows for enhanced range accuracy. The nominal clock frequency of 430 MHz is counted in a 15 bit counter which gives a maximum round trip delay of 76.2 microseconds, or a one way delay of 38.1 microseconds, or an effective maximum range of less than 11,430 meters. The accuracy of the on board clock may be calibrated against the known delay differential between the undelayed ARC signal 69, and the delayed ARC signal 71. If the embedded differential delay 70 is 50 meters, and is measured during a calibration sequence using a precision timing reference such as a high speed oscilloscope, as having a time delay of 163 nanoseconds, the on board clock at 430 MHz should register a count of 70.09. Because this is not a whole number, a phase comparator will be able to indicate to a voltage controlled oscillator to adjust the phase of the clock by 0.09 of a cycle over the nominal count of 70 for the given chip time of 2.3256 nanoseconds associated with the nominal 430 MHz clock frequency. A simpler solution is to mathematically scale all the results of the distance measurements by the fraction of 70.09/70, and to leave the clock as a fixed, and therefore more accurate timing reference, stabilized internally or by a thermally isolated crystal or dielectric resonator. Both these solutions are anticipated by the instant invention with similar beneficial effects.

Referring to FIG. 6 which shows the physical layout of the ARC signal coupling to the selected APD Focal Plane Array 73 pixels, the two fibers 69 and 71 are coupled side by side into GRIN lens 89 which is attached to positioning substrate 90. Positioning substrate 90 is held in optically aligned position by L-shaped projection 92 attached to base plate 93. Positioning substrate 90 is fitted with ARC mirror surface 91 which directs the light from the two adjacent optical fibers 69 and 71 onto adjacent pixels in the 128×128 APD Focal Plane Array 73 which sits atop Readout IC (76 and 74). Positioning substrate 90 may be a stainless steel flat with ARC mirror surface 91 precision machined into the surface, or bent upwards from a flat stainless steel sheet. Other reflective materials may be used for positioning substrate 90 and ARC reflective mirror surface 91 which perform the same functions, such as certain types of glass, metal coated ceramics, metallized molded plastics, etc., without changing the nature or positive effects of the described structure.

FIG. 6A shows an alternative embodiment of the ARC Pixel Coupling structure described in FIG. 6 above. In this case, the major changes are the elimination of positioning substrate 90, ARC mirror surface 91, and GRIN lens 89. Projection 92 has been modified from the L-shape of FIG. 6 to a straight shape with a V-grooved surface feature 94 which captures optical fibers 69 and 71, respectively, and holds them in optical alignment and in close proximity with the selected ARC pixels of APD Focal Plane Array 73. For the purposes of visual clarity, optical fibers 69 and 71 are shown in FIG. 6A illuminating ARC pixels which are not adjacent, but it is possible for optical fibers 69 and 71 to be held in the same projection 92 which would have two V-grooved surface features 94 side-by-side, or on some integer multiple of the pixel-to-pixel pitch of the APD Focal Plane Array 73.

FIG. 6B shows a further alternative embodiment of the ARC Pixel Coupling structure described in FIG. 6 above. In this case, the design uses positioning substrate 90 as in FIG. 6, and an ARC mirror surface 95 which is angle polished onto the end of optical fibers 69 and 71 and which directs the ARC optical signals onto the selected pixels of APD Focal Plane Array 73. Optical fibers 69 and 71 are either epoxied to positioning substrate 90, or embedded into positioning substrate 90 and then secured in position. Positioning substrate 90 may be a rigid/flexible optical fiber assembly commonly known in the art as rigid/flex, flexible optical backplane, or flex-fiber. Projection 92 has been modified from the L-shape of FIG. 6 to a straight shape wherein the top surface provides a location and support for the optical alignment of optical fibers 69 and 71 to the desired pixels.

Although the invention of the flash laser radar (flash ladar) system has been specified in terms of preferred and alternative embodiments, it is intended the invention shall be described by the following claims and their equivalents.

The invention claimed is:

1. A flash laser radar having a field of view, the flash laser radar comprising:
 a pulsed laser transmitter having an optical axis and a pulsed laser light output, and a diffusing optic adapted to illuminate a scene in the field of view with a pattern of light intensity;
 the pulsed laser transmitter comprising a solid state gain media interposed between two mirrors, and coupled to a Q-switch, and said solid state gain media optically pumped by at least one laser diode, and said at least one laser diode electrically driven by an electrical current issuing from a laser controller,
 a zero time reference generator generating a time zero output and signal which indicates the emission of pulsed laser light output, and the time zero output terminating the electrical current issuing from said laser controller;
 receive optics boresighted along the optical axis, the receive optics adapted to collect and condition an incident optical signal of pulsed laser light reflected from the scene in the field of view;

an optical receiver with a light detecting focal plane array having a plurality of light detecting pixels, the light detecting focal plane array disposed to intercept said collected and conditioned incident optical signal from the receive optics; and wherein each individual pixel in the light detecting focal plane array receives a pixellated portion of the incident optical signal of pulsed laser light reflected from the scene in the field of view; and each individual pixel is adapted to convert incident pulsed laser light into an opto-electric pulse signal;

a system controller having a laser pulse initiation output connected to the laser controller of said pulsed laser transmitter, and said laser pulse initiation output generating a signal which initiates the electrical current issuing from said laser controller, and said system controller also adapted to control the operations of the optical receiver;

a plurality of unit cell electrical circuits, each unit cell electrical circuit connected to an individual pixel of the light detecting focal plane array; and each unit cell electrical circuit adapted to detect an opto-electric pulse and having a detected pulse output;

a plurality of timing circuits, each timing circuit connected to the time zero output and adapted to initiate timing upon a transition of the time zero output, and each timing circuit also connected to a detected pulse output of a unit cell electrical circuit, and each timing circuit adapted to stop timing upon a transition of the detected pulse output, and said timing circuit adapted to produce a timing output value proportional to the elapsed time between the zero time reference and a detected pulse output; and an optical sampler positioned in the output path of the pulsed laser transmitter, the optical sampler adapted to collect a portion of the aforesaid pulsed laser light output;

wherein the optical sampler is connected via an optical pathway to at least one individual pixel of the light detecting focal plane array.

2. The flash laser radar of claim 1 wherein the optical sampler is optically connected to the at least one individual pixel of said light detecting focal plane array via an optical waveguide.

3. The flash laser radar of claim 2 wherein the optical waveguide is an optical fiber.

4. The flash laser radar of claim 1 wherein the optical sampler is an endface of an optical fiber.

5. The flash laser radar of claim 1 wherein the solid state gain media is a rod shape and said solid state gain media has a cross section selected from the group consisting of: square, hexagonal, octagonal, circular, rectangular, and elliptical.

6. The flash laser radar of claim 1 wherein the solid state gain media is a neodymium: YAG crystal.

7. The flash laser radar of claim 1 wherein the at least one laser diode is optically coupled to the solid state gain media through an optical waveguide.

8. The flash laser radar of claim 1 wherein the at least one laser diode is optically coupled to the solid state gain media through a lens.

9. The flash laser radar of claim 1 wherein the Q-switch is optically triggered by a light pulse from a semiconductor laser optically coupled to the Q-switch, said light pulse initiated by a laser transmitter controller.

10. The flash laser radar of claim 1 wherein the Q-switch has a non uniform bleaching threshold, which increases with radial distance from a central optical axis.

11. The flash laser radar of claim 1 wherein the Q-switch has a non uniform doping profile which increases with radial distance from a central optical axis.

12. The flash laser radar of claim 1 wherein at least one laser diode is disposed so as to have an optical output directed substantially along the optical axis of said state gain media and optically coupled to said solid state gain media, thereby end pumping the solid state gain media.

13. The flash laser radar of claim 12 wherein the optical output of at least one laser diode is optically coupled to an end face of said solid state gain media through an optical waveguide.

14. The flash laser radar of claim 12 wherein the optical output of at least one laser diode is optically coupled to an end face of said laser gain media through a refractive optic.

15. The flash laser radar of claim 1 wherein the pulsed laser transmitter is a disc laser comprised of at least the following elements optically coupled in a substantially linear arrangement along an optical axis, with the elements being, in order:

a back facet mirror optically coupled to a thin disc laser gain media which is then optically coupled to an intracavity mirror, which is then optically coupled to a Q-switch which is then optically coupled to a front facet mirror.

16. The flash laser radar of claim 15 wherein the thin disc laser gain media is selected from the group consisting of: erbium doped glass and erbium doped phosphate glass.

17. The flash laser radar of claim 15 wherein a portion of the back facet mirror is a convergent mirror.

18. The flash laser radar of claim 15 wherein the thin disc laser gain media is less than 500 wavelengths thick at the lasing wavelength.

19. The flash laser radar of claim 15 wherein the diameter of the thin disc laser gain media is greater than 1000 times the lasing wavelength.

20. The flash laser radar of claim 15 wherein the thin disc laser gain media has a cross sectional profile selected from the group consisting of: a regular polygon and a circle.

21. The flash laser radar of claim 15 wherein the thin disc laser gain media is optically pumped from a plurality of sides by a plurality of laser diodes positioned in a plane perpendicular to the optical axis of the pulsed laser transmitter.

22. The flash laser radar of claim 21 wherein at least one of the laser diodes is optically coupled to the thin disc laser gain media through a lens.

23. The flash laser radar of claim 21 wherein at least one of the laser diodes is optically coupled to the thin disc laser gain media through a waveguide.

24. The flash laser radar of claim 15 wherein the Q-switch is optically triggered by a light pulse from a semiconductor laser optically coupled to the Q-switch, said light pulse initiated by a laser transmitter controller.

25. The flash laser radar of claim 15 wherein the Q-switch has a non uniform bleaching threshold, increasing with radial distance from a central optical axis.

26. The flash laser radar of claim 15 wherein the Q-switch has a non uniform doping profile, the non uniform doping profile increasing with radial distance from a central optical axis.

27. The flash laser radar of claim 1 wherein said at least one optical sampler is optically connected to at least one individual pixel of said light detecting focal plane array via optical pathway consisting of an optical waveguide, a lens, and a mirror surface.

28. The flash laser radar of claim 1 wherein said at least one optical sampler is optically connected to at least one individual pixel of said light detecting focal plane array via optical pathway consisting of an optical waveguide, and wherein said optical waveguide has an angle polished endface for directing light towards at least one individual pixel.

29. A flash laser radar having a field of view, the flash laser radar comprising:
a pulsed laser transmitter having an optical axis and a pulsed laser light output, and a diffusing optic adapted to illuminate a scene in the field of view with a pattern of light intensity;
the pulsed laser transmitter comprising a solid state gain media interposed between two mirrors, and coupled to a Q-switch, and said solid state gain media optically pumped by at least one laser diode, and said at least one laser diode electrically driven by an electrical current issuing from a laser controller,
a zero time reference generator generating a time zero output and signal which indicates the emission of pulsed laser light output, and the time zero output terminating the electrical current issuing from said laser controller;
receive optics boresighted along the optical axis, the receive optics adapted to collect and condition an incident optical signal of pulsed laser light reflected from the scene in the field of view;
an optical receiver with a light detecting focal plane array having a plurality of light detecting pixels, the light detecting focal plane array disposed to intercept said collected and conditioned incident optical signal from the receive optics; and
wherein each individual pixel in the light detecting focal plane array receives a pixellated portion of the incident optical signal of pulsed laser light reflected from the scene in the field of view; and
each individual pixel is adapted to convert incident pulsed laser light into an opto-electric pulse signal;
a system controller having a laser pulse initiation output connected to the laser controller of said pulsed laser transmitter, and said laser pulse initiation output generating a signal which initiates the electrical current issuing from said laser controller, and said system controller also adapted to control the operations of the optical receiver;
a readout integrated circuit having a plurality of unit cell electrical circuits, each unit cell electrical circuit connected to an individual pixel of the light detecting focal plane array; and
each unit cell electrical circuit adapted to detect an opto-electric pulse and having a detected pulse output;
a plurality of timing circuits, and each timing circuit connected to the time zero output and adapted to initiate timing upon a transition of the time zero output, and each timing circuit also connected to a detected pulse output of a unit cell electrical circuit, and each timing circuit adapted to stop timing upon a transition of the detected pulse output, and said timing circuit adapted to produce a timing output value proportional to the elapsed time between the zero time reference and a detected pulse output; and said readout integrated circuit adapted to output the timing output values, and
an optical sampler positioned in the output path of the pulsed laser transmitter, the optical sampler adapted to collect a portion of the aforesaid pulsed laser light output;
wherein the optical sampler is connected via an optical pathway to at least one reference pixel of the light detecting focal plane array, and the zero time reference generator connected to said reference pixel, and adapted to produce the time zero output.

30. The flash laser radar of claim 29 wherein the optical sampler is optically connected to the at least one individual pixel of said light detecting focal plane array via an optical waveguide.

31. The flash laser radar of claim 30 wherein the said optical waveguide is an optical fiber.

32. The flash laser radar of claim 29 wherein the optical sampler is an endface of an optical fiber.

33. The flash laser radar of claim 29 wherein the solid state gain media is a rod shape and said solid state gain media has a cross section selected from the group consisting of: square, hexagonal, octagonal, circular, rectangular, and elliptical.

34. The flash laser radar of claim 29 wherein the solid state gain media is a neodymium: YAG crystal.

35. The flash laser radar of claim 29 wherein the Q-switch is optically triggered by a light pulse from a semiconductor laser optically coupled to the Q-switch, said light pulse initiated by a laser transmitter controller.

36. The flash laser radar of claim 29 wherein the Q-switch has a non uniform bleaching threshold, which increases with radial distance from a central optical axis.

37. The flash laser radar of claim 29 wherein the Q-switch has a non uniform doping profile which increases with radial distance from a central optical axis.

38. The flash laser radar of claim 29 wherein the optical output of at least one laser diode is optically coupled to an end face of said solid state gain media through an optical waveguide.

39. The flash laser radar of claim 29 wherein the at least one laser diode is optically coupled to the solid state gain media through a lens.

40. The flash laser radar of claim 29 further comprising at least one laser diode positioned to have an optical output directed substantially along the optical axis of said state gain media and optically coupled to said solid state gain media, thereby end pumping the solid state gain media.

41. The flash laser radar of claim 29 wherein the pulsed laser transmitter is a disc laser comprised of at least the following elements optically coupled in a substantially linear arrangement along an optical axis, with the elements being, in order:
a back facet mirror optically coupled to a thin disc laser gain media which is then optically coupled to an intra-cavity mirror, which is then optically coupled to a Q-switch which is then optically coupled to a front facet mirror.

42. The flash laser radar of claim 41 wherein the thin disc laser gain media is selected from the group consisting of: erbium doped glass and erbium doped phosphate glass.

43. The flash laser radar of claim 41 wherein the thin disc laser gain media is less than 500 wavelengths thick at the lasing wavelength.

44. The flash laser radar of claim 41 wherein the diameter of the thin disc laser gain media is greater than 1000 times the lasing wavelength.

45. The flash laser radar of claim 41 wherein the thin disc laser gain media has a cross sectional profile selected from the set of: a regular polygon and a circle.

46. The flash laser radar of claim 41 wherein the thin disc laser gain media is optically pumped from a plurality of sides by a plurality of laser diodes positioned in a plane perpendicular to the optical axis of the pulsed laser transmitter.

47. The flash laser radar of claim 41 wherein at least one of the laser diodes is optically coupled to the thin disc laser gain media through a lens.

48. The flash laser radar of claim 41 wherein at least one of the laser diodes is optically coupled to the thin disc laser gain media through a waveguide.

49. The flash laser radar of claim 41 wherein the Q-switch has a non-uniform bleaching threshold, the bleaching threshold increasing with radial distance from a central optical axis.

50. The flash laser radar of claim 41 wherein the Q-switch has a non uniform doping profile, the doping profile increasing with radial distance from a central optical axis.

* * * * *